United States Patent
Sun et al.

(10) Patent No.: US 11,782,561 B2
(45) Date of Patent: Oct. 10, 2023

(54) DISPLAY PANEL, TOUCH CONTROL STRUCTURE AND DISPLAY DEVICE

(71) Applicant: BOE Technology Group Co., Ltd., Beijing (CN)

(72) Inventors: Xuefei Sun, Beijing (CN); Jaegeon You, Beijing (CN); Liyan Liu, Beijing (CN); Xinxing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 135 days.

(21) Appl. No.: 17/274,776

(22) PCT Filed: May 29, 2020

(86) PCT No.: PCT/CN2020/093489
§ 371 (c)(1),
(2) Date: Mar. 9, 2021

(87) PCT Pub. No.: WO2021/237723
PCT Pub. Date: Dec. 2, 2021

(65) Prior Publication Data
US 2022/0197438 A1    Jun. 23, 2022

(51) Int. Cl.
*G06F 3/044* (2006.01)
*G06F 3/041* (2006.01)
*H10K 59/40* (2023.01)

(52) U.S. Cl.
CPC ........ *G06F 3/0446* (2019.05); *G06F 3/04164* (2019.05); *H10K 59/40* (2023.02);
(Continued)

(58) Field of Classification Search
CPC ............... G06F 3/0446; G06F 3/04164; G06F 2203/04111; G06F 2203/04112; H01L 27/323
(Continued)

(56) References Cited

U.S. PATENT DOCUMENTS

2015/0101919 A1    4/2015    Bae et al.
2016/0091998 A1*   3/2016    Chyan ................. G06F 3/04883
                                                        345/174
(Continued)

FOREIGN PATENT DOCUMENTS

CN    202735635 U    2/2013
CN    104699318 A    6/2015
(Continued)

OTHER PUBLICATIONS

European Search Report for EP20904255.5 dated Jul. 7, 2022.

*Primary Examiner* — Mark Edwards
(74) *Attorney, Agent, or Firm* — Ling Wu; Stephen Yang; Ling and Yang Intellectual Property

(57) ABSTRACT

A display panel, a touch control structure and a display device are provided. The display panel includes a touch control structure layer including a plurality of mesh pattern units which are polygons formed by metal wires. The touch control structure layer includes a bridge layer, an insulating layer and a touch control layer. The touch control layer includes a plurality of first touch control electrodes and first connecting parts arranged along a first extending direction and a plurality of second touch control electrodes arranged along a second extending direction. The plurality of first touch control electrodes and first connecting parts are alternately arranged and serially coupled, and the second touch control electrodes are arranged at intervals.

14 Claims, 15 Drawing Sheets

(52) U.S. Cl.
 CPC ............... *G06F 2203/04111* (2013.01); *G06F 2203/04112* (2013.01)

(58) Field of Classification Search
 USPC .......................................................... 345/174
 See application file for complete search history.

(56) References Cited

U.S. PATENT DOCUMENTS

| | | |
|---|---|---|
| 2016/0291752 A1 | 10/2016 | Li et al. |
| 2018/0122867 A1 | 5/2018 | Choe et al. |
| 2018/0190723 A1 | 7/2018 | Han et al. |
| 2019/0050104 A1* | 2/2019 | Na ........................ G06F 3/044 |
| 2019/0121474 A1* | 4/2019 | Lee ....................... G06F 3/0448 |
| 2019/0146605 A1 | 5/2019 | Xu et al. |
| 2019/0146608 A1 | 5/2019 | Lee et al. |
| 2019/0187850 A1* | 6/2019 | Kim ...................... G06F 1/1643 |
| 2020/0033996 A1 | 1/2020 | Zhong et al. |
| 2020/0050300 A1 | 2/2020 | Kwon et al. |
| 2020/0142530 A1* | 5/2020 | Lee .................... H10K 59/1213 |
| 2020/0293142 A1 | 9/2020 | Jeong et al. |
| 2020/0303467 A1 | 9/2020 | Feng |
| 2021/0026498 A1* | 1/2021 | Moy ..................... G06F 3/0412 |
| 2021/0208710 A1 | 7/2021 | Han et al. |

FOREIGN PATENT DOCUMENTS

| | | |
|---|---|---|
| CN | 106484200 A | 3/2017 |
| CN | 106658629 A | 5/2017 |
| CN | 107402669 A | 11/2017 |
| CN | 107831957 A | 3/2018 |
| CN | 107957821 A | 4/2018 |
| CN | 108010938 A | 5/2018 |
| CN | 108693994 A | 10/2018 |
| CN | 108958563 A | 12/2018 |
| CN | 109799923 A | 5/2019 |
| CN | 110007808 A | 7/2019 |
| CN | 110347275 A | 10/2019 |
| JP | 2011-59771 A | 3/2011 |

\* cited by examiner

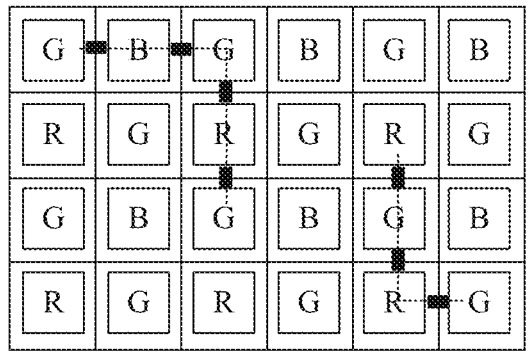
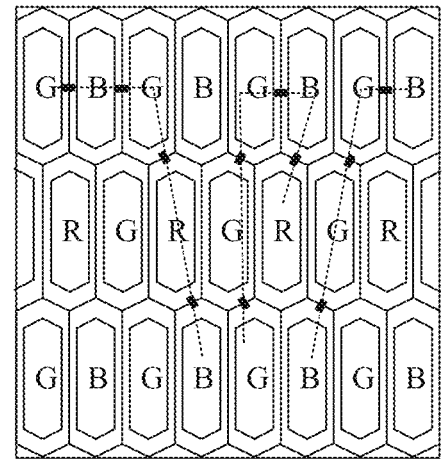
FIG. 13-1                FIG. 13-2
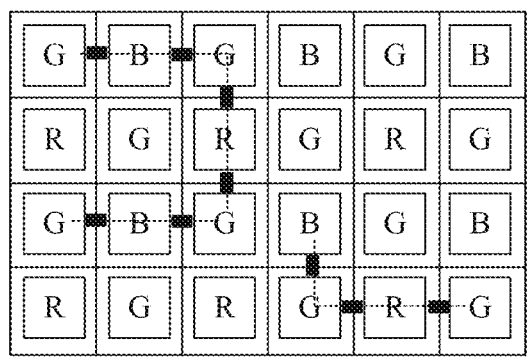
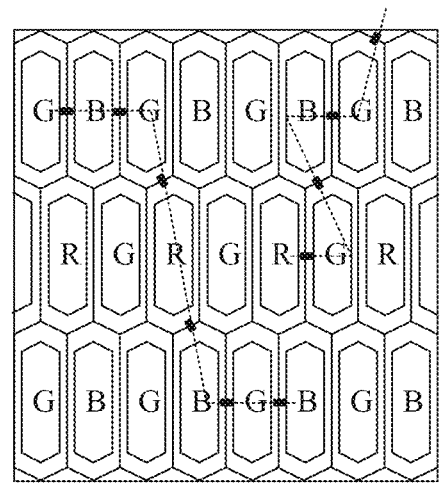
FIG. 14-1                FIG. 14-2
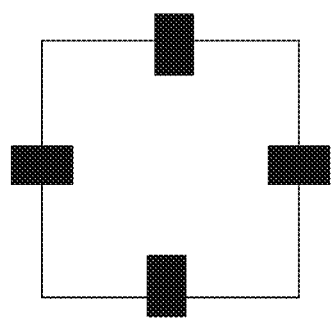
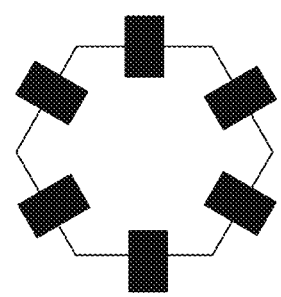
FIG. 15-1                FIG. 15-2

DISPLAY PANEL, TOUCH CONTROL STRUCTURE AND DISPLAY DEVICE

TECHNICAL FIELD

The present disclosure relates to but is not limited to the technical field of display, in particular to a display panel, a touch control structure and a display device.

BACKGROUND

Organic Light Emitting Diode (OLED) is an active light emitting display component with the advantages of self-illumination, wide viewing angle, high contrast, low power consumption, extremely high response speed, etc. With the continuous development of display technology, Flexible Display device with OLED as a light emitting device and Thin Film Transistor (TFT) for implementing signal control has become the mainstream product in the display field.

Limited by product requirements such as flexible folding and narrow frame, etc., the touch control structure layer of OLED is in a form of Flexible Multi-Layer On Cell (FM-LOC). The flexible touch control structure layer is provided on an encapsulation layer of the OLED backplane and has the advantages of lightness, thinness and foldability. For the purpose of reducing resistance and improving sensitivity, the driving electrode (Tx) and sensing electrode (Rx) of the touch control structure layer are in a form of Metal Mesh. Compared with using transparent conductive material (such as Indium Tin Oxide, ITO) to form a touch control electrode, Metal Mesh has the advantages of low resistance, less thickness and fast response speed, etc.

SUMMARY

The following is a summary of the subject matter described in detail in the present disclosure. This summary is not intended to limit the protection scope of the claims.

In one aspect, a display panel is provided in this disclosure, including: a substrate, a display structure layer disposed on the substrate and a touch control structure layer disposed on the display structure layer, wherein the display structure layer comprises a light-emitting region and a non-light-emitting region, the light-emitting region comprises a plurality of periodically-arranged subpixels, and the non-light-emitting region comprises subpixel boundaries between adjacent subpixels; the touch control structure layer comprises a plurality of mesh pattern units which are polygons formed by metal wires, and a region enclosed by orthographic projections of the metal wires on the substrate contains an orthographic projection of at least one subpixel on the substrate, and orthographic projections of subpixel boundaries on the substrate contain the orthographic projections of the metal wires on the substrate;

the touch control structure layer comprises a bridge layer, an insulating layer and a touch control layer which are in a stacked arrangement, wherein the touch control layer comprises a plurality of first touch control electrodes and a plurality of first connecting parts arranged sequentially along a first extending direction and a plurality of second touch control electrodes arranged sequentially along a second extending direction, wherein the first extending direction intersects with the second extending direction; the plurality of first touch control electrodes and the plurality of first connecting parts are arranged alternately and connected in sequence, and the plurality of second touch control electrodes are arranged at intervals; the bridge layer comprises a plurality of connecting bridges and each connecting bridge comprises bonding pad parts and second connecting wires, wherein the bonding pad parts are configured to be coupled with adjacent second touch control electrodes through via holes on the insulating layer and the second connecting wires are configured to be coupled with the bonding pad parts;

the touch control structure layer comprises a Bridge region which further comprises a plurality of second connecting units and first connecting wires, wherein the second connecting units and first connecting wires are arranged at intervals and insulated from each other, positions of the second connecting units correspond to positions of the bonding pad parts on the bridge layer, the second connecting units are configured to be coupled with the bonding pad parts through via holes on the insulating layer, orthographic projections of the first connecting wires on the substrate basically are overlapped with orthographic projections of the second connecting wires on the substrate.

In some possible implementations, the first connecting wires on the touch control structure layer comprises a plurality of mesh pattern units which are provided with a plurality of cuts for disconnecting the metal wires of the mesh pattern units, wherein a mesh pattern unit at least comprises two mutually parallel first sides and two mutually parallel second sides, and the first sides and the second sides are non-parallel;

the cuts comprise consecutive cuts, a quantity of cuts in the consecutive cuts is less than or equal to 3, the consecutive cuts are cuts which are provided on both of the two first sides of each mesh pattern unit in at least one mesh pattern unit arranged continuously along a first direction, wherein the first direction intersects with the first sides of each mesh pattern unit, or the consecutive cuts are cuts which are provided on both of the two second sides of each mesh pattern unit in at least one mesh pattern unit arranged continuously along a second direction, wherein the second direction intersects with the second sides of each mesh pattern unit.

In some possible implementations, the cuts further comprise corner cuts, in a situation that the corner cuts have consecutive cuts along the first direction or the second direction, a quantity of cuts in the consecutive cuts is less than or equal to 2; the corner cuts are cuts arranged on one first side and one second side of the mesh pattern unit.

In some possible implementations, when there are a plurality of the corner cuts, the plurality of corner cuts are formed an open shape.

In some possible implementations, the touch control structure layer further comprises a Bulk region and a Boundary region, the Bulk region comprises the first touch control electrodes and the second touch control electrodes, and each mesh pattern unit located in the Boundary region is provided with cuts for disconnecting metal wires of the mesh pattern units, which enable each mesh pattern unit to be divided into two parts respectively belonging to the first touch control electrodes and the second touch control electrodes; in a plurality of repeating units which are repetitively and continuously arranged for forming the touch control structure layer, the repeating units are divided into first repeating units containing cuts in the Bridge region, second repeating units containing cuts in the Bulk region and third repeating units containing cuts in the Boundary region;

a ratio of a cut density of the first repeating units to a cut density of the second repeating units is 0.7-1.3; a ratio of the cut density of the first repeating units to a cut density of the third repeating units is 0.7-1.3; a ratio of the cut density of the second repeating units to the cut density of the third repeating units is 0.7-1.3; the cut density is a ratio of a quantity of cuts in the repeating units to a quantity of mesh pattern units in the repeating units.

In some possible implementations, the cuts at least comprise first direction cuts that disconnect the first sides and second direction cuts that disconnect the second sides, wherein the ratio of the cut density of the first repeating units to the cut density of the second repeating units is 0.7-1.3, which comprises any one or more of the following: a ratio of a first direction cut density of the first repeating units to a first direction cut density of the second repeating units is 0.7-1.3; a ratio of a second direction cut density of the first repeating units to a second direction cut density of the second repeating units is 0.7-1.3;

the ratio of the cut density of the first repeating units to the cut density of the third repeating units is 0.7-1.3, which comprises any one or more of the following: a ratio of a first direction cut density of the first repeating units to a first direction cut density of the third repeating units is 0.7-1.3; a ratio of a second direction cut density of the first repeating units to a second direction cut density of the third repeating units is 0.7-1.3;

the ratio of the cut density of the second repeating units to the cut density of the third repeating units is 0.7-1.3, which comprises any one or more of the following: a ratio of a first direction cut density of the second repeating units to a first direction cut density of the third repeating units is 0.7-1.3; a ratio of a second direction cut density of the second repeating units to a second direction cut density of the third repeating units is 0.7-1.3;

the first direction cut density is a ratio of a quantity of the first direction cuts in the repeating units to a quantity of the mesh pattern units in the repeating units, and the second direction cut density is a ratio of a quantity of the second direction cuts in the repeating units to the quantity of the mesh pattern units in the repeating units.

In some possible implementations, the plurality of subpixels comprise first subpixels emitting a first color, second subpixels emitting a second color and third subpixels emitting a third color; in the first repeating units, the second repeating units and the third repeating units, the cuts comprise first cuts between the first and second subpixels, second cuts between the second and third subpixels and third cuts between the first and third subpixels;

in the first repeating units, the second repeating units and the third repeating units, a ratio of a first cut density to a second cut density is 0.7-1.3; a ratio of a second cut density to a third cut density is 0.7-1.3; a ratio of a first cut density to a third cut density is 0.7-1.3;

the first cut density is a ratio of a quantity of first cuts in the repeating units to a quantity of the mesh pattern units in the repeating units; the second cut density is a ratio of a quantity of second cuts in the repeating units to the quantity of the mesh pattern units in the repeating units; and the third cut density is a ratio of a quantity of third cuts in the repeating units to the quantity of the mesh pattern units in the repeating units.

In some possible implementations, the ratio of the first cut density to the second cut density is 0.7-1.3, which comprises any one or more of the following: a ratio of a first horizontal cut density to a second horizontal cut density is 0.7-1.3; a ratio of a first vertical cut density to a second vertical cut density is 0.7-1.3; and a ratio of a first diagonal cut density to a second diagonal cut density is 0.7-1.3;

the ratio of the second cut density to the third cut density is 0.7-1.3, which comprises any one or more of the following: a ratio of a second horizontal cut density to a third horizontal cut density is 0.7-1.3; a ratio of a second vertical cut density to a third vertical cut density is 0.7-1.3; and a ratio of a second diagonal cut density to a third diagonal cut density is 0.7-1.3;

the ratio of the first cut density to the third cut density is 0.7-1.3, which comprises any one or more of the following: a ratio of a first horizontal cut density to a third horizontal cut density is 0.7-1.3; a ratio of a first vertical cut density to a third vertical cut density is 0.7-1.3; and a ratio of a first diagonal cut density to a third diagonal cut density is 0.7-1.3.

In some possible implementations, a ratio of the first cut density of the first repeating units to the first cut density of the second repeating units is 0.7-1.3; a ratio of the second cut density of the first repeating units to the second cut density of the second repeating units is 0.7-1.3; and a ratio of the third cut density of the first repeating units to the third cut density of the second repeating units is 0.7-1.3;

a ratio of the first cut density of the first repeating units to the first cut density of the third repeating units is 0.7-1.3; a ratio of the second cut density of the first repeating units to the second cut density of the third repeating units is 0.7-1.3; and a ratio of the third cut density of the first repeating units to the third cut density of the third repeating units is 0.7-1.3;

a ratio of the first cut density of the second repeating units to the first cut density of the third repeating units is 0.7-1.3; a ratio of the second cut density of the second repeating units to the second cut density of the third repeating units is 0.7-1.3; and a ratio of the third cut density of the second repeating units to the third cut density of the third repeating units is 0.7-1.3.

In some possible implementations, a maximum characteristic length of the second repeating unit is S, wherein, $S=L*\tan(1/(57.3*CPD))$, L is a distance from a viewer's eyes to a display screen, CPD is a spatial frequency of the viewer's eyes within a range of 1 degree, L is between 100 mm to 1000 mm and CPD is greater than or equal to 10; the maximum characteristic length of the repeating unit is a maximum size of the repeating unit in a certain direction.

In some possible implementations, when the distance from the viewer's eyes to the display screen is 100 mm to 400 mm, the maximum characteristic length of the second repeating unit is 0.2 mm to 0.4 mm; when the distance from the viewer's eyes to the display screen is 400 mm to 1000 mm, the maximum characteristic length of the second repeating unit is 0.4 mm to 1.2 mm.

In another aspect, a display device is provided in this disclosure, including the aforementioned display panel.

In another aspect, a touch control structure is provided in this disclosure, including a plurality of mesh pattern units which are polygons formed of metal wires, the touch control structure comprises a bridge layer, an insulating layer and a touch control layer which are in a stacked arrangement, wherein the touch control layer comprises a plurality of first touch control electrodes and a plurality of first connecting parts arranged sequentially along a first extending direction and a plurality of second touch control electrodes arranged sequentially along a second extending direction, wherein the first extending direction intersects with the second extending direction; the plurality of first touch control electrodes and the plurality of first connecting parts are arranged alternately and connected in sequence, and the plurality of second touch control electrodes are arranged at intervals; the bridge layer comprises a plurality of connecting bridges and each connecting bridge comprises bonding pad parts and second connecting wires, wherein the bonding pad parts are configured to be coupled with adjacent second touch control electrodes through via holes on the insulating layer and the second connecting wires are configured to be coupled with the bonding pad parts;

the touch control structure layer comprises a Bridge region which further comprises a plurality of second connecting units and first connecting wires, wherein the second connecting units and first connecting wires are arranged at intervals and insulated from each other, positions of the second connecting units correspond to positions of the bonding pad parts on the bridge layer, the second connecting units are configured to be coupled with the bonding pad parts through via holes on the insulating layer, orthographic projections of the first connecting wires on the substrate basically are overlapped with orthographic projections of the second connecting wires on the substrate.

In some possible implementations, the first connecting wires in the touch control structure comprises a plurality of mesh pattern units which are provided with a plurality of cuts for disconnecting the metal wires of the mesh pattern units, wherein a mesh pattern unit at least comprises two mutually parallel first sides and two mutually parallel second sides and the first sides and the second sides are non-parallel;

the cuts comprise consecutive cuts, a quantity of cuts in the consecutive cuts is less than or equal to 3, the consecutive cuts are cuts which are provided on both of the two first sides of each mesh pattern unit in at least one mesh pattern unit arranged continuously along a first direction, wherein the first direction intersects with the first sides of each mesh pattern unit, or the consecutive cuts are cuts which are provided on both of the two second sides of each mesh pattern unit in at least one mesh pattern unit arranged continuously along a second direction, wherein the second direction intersects with the second sides of each mesh pattern unit.

In some possible implementations, the cuts further comprise corner cuts, in a situation that the corner cuts have consecutive cuts along the first direction or the second direction, a quantity of cuts in the consecutive cuts is less than or equal to 2; the corner cuts are cuts arranged on one first side and one second side of the mesh pattern unit.

In some possible implementations, when there are a plurality of the corner cuts, the plurality of corner cuts are formed an open shape.

In some possible implementations, the touch control structure further comprises a Bulk region and a Boundary region, the Bulk region comprises the first touch control electrodes and the second touch control electrodes, and each mesh pattern unit located in the Boundary region is provided with cuts for disconnecting metal wires of the mesh pattern units, which enable each mesh pattern unit to be divided into two parts respectively belonging to the first touch control electrodes and the second touch control electrodes; in a plurality of repeating units which are repetitively and continuously arranged for forming the touch control structure, the repeating units are divided into first repeating units containing cuts in the Bridge region, second repeating units containing cuts in the Bulk region and third repeating units containing cuts in the Boundary region;

a ratio of a cut density of the first repeating units to a cut density of the second repeating units is 0.7-1.3; a ratio of the cut density of the first repeating units to a cut density of the third repeating units is 0.7-1.3; a ratio of the cut density of the second repeating units to the cut density of the third repeating units is 0.7-1.3; the cut density is a ratio of a quantity of cuts in the repeating units to a quantity of mesh pattern units in the repeating units.

In some possible implementations, the cuts at least comprise first direction cuts that disconnect the first sides and second direction cuts that disconnect the second sides, wherein the ratio of the cut density of the first repeating units to the cut density of the second repeating units is 0.7-1.3, which comprises any one or more of the following: a ratio of a first direction cut density of the first repeating units to a first direction cut density of the second repeating units is 0.7-1.3; a ratio of a second direction cut density of the first repeating units to a second direction cut density of the second repeating units is 0.7-1.3;

the ratio of the cut density of the first repeating units to the cut density of the third repeating units is 0.7-1.3, which comprises any one or more of the following: a ratio of a first direction cut density of the first repeating units to a first direction cut density of the third repeating units is 0.7-1.3; a ratio of a second direction cut density of the first repeating units to a second direction cut density of the third repeating units is 0.7-1.3;

the ratio of the cut density of the second repeating units to the cut density of the third repeating units is 0.7-1.3, which comprises any one or more of the following: a ratio of a first direction cut density of the second repeating units to a first direction cut density of the third repeating units is 0.7-1.3; a ratio of a second direction cut density of the second repeating units to a second direction cut density of the third repeating units is 0.7-1.3;

the first direction cut density is a ratio of a quantity of first direction cuts in the repeating units to the quantity of the mesh pattern units in the repeating units, and the second direction cut density is a ratio of a quantity of second direction cuts in the repeating units to the quantity of the mesh pattern units in the repeating units.

In some possible implementations, the plurality of subpixels comprise first subpixels emitting a first color, second subpixels emitting a second color and third subpixels emitting a third color; in the first repeating units, the second repeating units and the third repeating units, the cuts comprise first cuts between the first and second subpixels, second cuts between the second and third subpixels and third cuts between the first and third subpixels;

in the first repeating units, the second repeating units and the third repeating units, a ratio of a first cut density to a second cut density is 0.7-1.3; a ratio of a first cut density to a third cut density is 0.7-1.3; a ratio of a second cut density to a third cut density is 0.7-1.3;

the first cut density is a ratio of a quantity of first cuts in the repeating units to the quantity of the mesh pattern units in the repeating units; the second cut density is a ratio of a quantity of second cuts in the repeating units to the quantity of the mesh pattern units in the repeating units; and the third cut density is a ratio of a quantity of third cuts in the repeating units to the quantity of the mesh pattern units in repeating units.

In some possible implementations, the ratio of the first cut density to the second cut density is 0.7-1.3, which comprises any one or more of the following: a ratio of a first horizontal cut density to a second horizontal cut density is 0.7-1.3; a ratio of a first vertical cut density to a second vertical cut density is 0.7-1.3; and a ratio of a first diagonal cut density to a second diagonal cut density is 0.7-1.3;

the ratio of the second cut density to the third cut density is 0.7-1.3, which comprises any one or more of the following: a ratio of a second horizontal cut density to a third horizontal cut density is 0.7-1.3; a ratio of a second vertical cut density to a third vertical cut density is 0.7-1.3; and a ratio of a second diagonal cut density to a third diagonal cut density is 0.7-1.3;

the ratio of the first cut density to the third cut density is 0.7-1.3, which comprises any one or more of the following: a ratio of a first horizontal cut density to a third horizontal cut density is 0.7-1.3; a ratio of a first vertical cut density to a third vertical cut density is 0.7-1.3; and a ratio of a first diagonal cut density to a third diagonal cut density is 0.7-1.3.

In some possible implementations, a ratio of the first cut density of the first repeating units to the first cut density of the second repeating units is 0.7-1.3; a ratio of the second cut density of the first repeating units to the second cut density of the second repeating units is 0.7-1.3; and a ratio of the third cut density of the first repeating units to the third cut density of the second repeating units is 0.7-1.3;

a ratio of the first cut density of the first repeating units to the first cut density of the third repeating units is 0.7-1.3; a ratio of the second cut density of the first repeating units to the second cut density of the third repeating units is 0.7-1.3; and a ratio of the third cut density of the first repeating units to the third cut density of the third repeating units is 0.7-1.3;

a ratio of the first cut density of the second repeating units to the first cut density of the third repeating units is 0.7-1.3; a ratio of the second cut density of the second repeating units to the second cut density of the third repeating units is 0.7-1.3; and a ratio of the third cut density of the second repeating units to the third cut density of the third repeating units is 0.7-1.3.

In some possible implementations, a maximum characteristic length of the second repeating unit is S, wherein, $S=L*\tan(1/(57.3*CPD))$, L is a distance from a viewer's eyes to a display screen, CPD is a spatial frequency of the viewer's eyes within a range of 1 degree, L is between 100 mm to 1000 mm and CPD is greater than or equal to 10; the maximum characteristic length of the repeating unit is a maximum size of the repeating unit in a certain direction.

In some possible implementations, when the distance from the viewer's eyes to the display screen is 100 mm to 400 mm, the maximum characteristic length of the second repeating unit is 0.2 mm to 0.4 mm; when the distance from the viewer's eyes to the display screen is 400 mm to 1000 mm, the maximum characteristic length of the second repeating unit is 0.4 mm to 1.2 mm.

Other aspects will become apparent upon reading and understanding the accompanying drawings and the detailed description.

DESCRIPTION OF THE DRAWINGS

Accompanying drawings are used to provide a further understanding of the technical solutions of the present disclosure, and are formed a part of the specification, which are used for explaining the technical solutions of the present disclosure together with embodiments of the present disclosure while not constituting any limitation on the technical solutions of the present disclosure. Shapes and sizes of the components in the drawings do not reflect real scales, and the purpose of these drawings is only for schematically illustrating the contents of the present disclosure.

FIG. 2-1 to FIG. 2-5 are schematic structural diagrams of a metal mesh.

FIG. 3 is a schematic structural diagram of a touch control structure layer in the form of a metal mesh.

FIG. 4 is a schematic structural diagram of a plan of a display structure layer.

FIG. 5-1 to FIG. 5-3 are schematic structural diagrams of pixel units.

FIG. 7-1 to FIG. 7-3 are schematic structural diagrams of the display panel according to an exemplary embodiment of the present disclosure.

FIG. 8-1 to FIG. 8-4 are schematic diagrams of the Bulk region, the Boundary region, and the Bridge region;

FIG. 9-1 to FIG. 9-2 are schematic diagrams of the mura defects of the Bridge region.

FIG. 10-1 to FIG. 10-3 are schematic structural diagrams of a metal mesh of the Bridge region;

FIG. 11-1 to FIG. 11-2 are schematic structural diagrams of a metal mesh of the Bridge region according to exemplary embodiments of the present disclosure;

FIG. 12-1 to FIG. 12-2 are schematic diagrams of the consecutive cuts according to exemplary embodiments of the present disclosure;

FIG. 13-1 to FIG. 13-2 are schematic diagrams of the corner cuts according to exemplary embodiments of the present disclosure;

FIG. 14-1 to FIG. 14-2 are schematic diagrams of open shapes according to exemplary embodiments of the present disclosure;

FIG. 15-1 to FIG. 15-2 are schematic diagrams of cuts of certain direction according to exemplary embodiments of the present disclosure;

FIG. 25-1 to FIG. 25-3 are schematic diagrams of shapes of repeating units.

DESCRIPTION OF THE REFERENCE NUMBERS IN THE DRAWINGS

Figure 1:
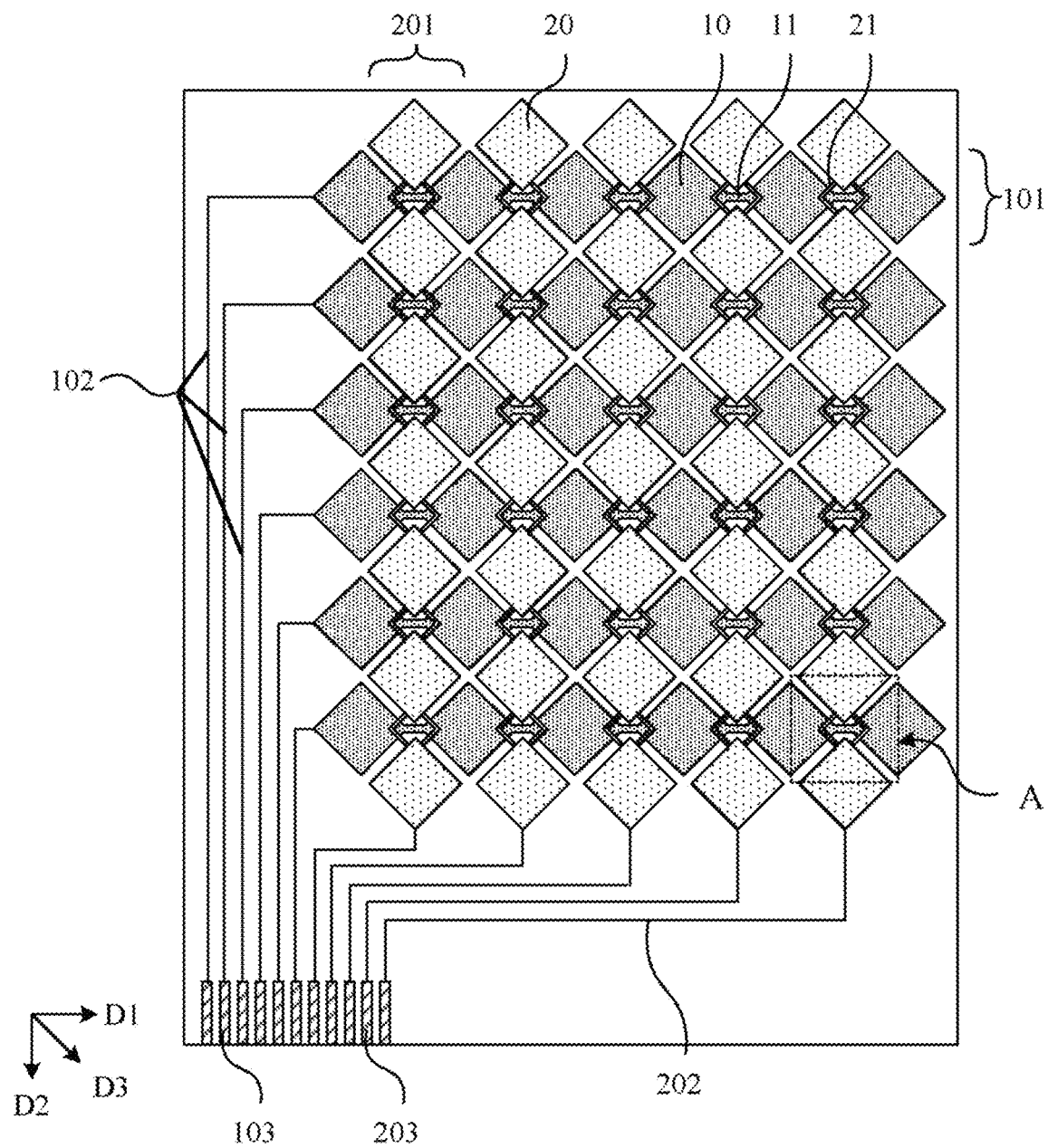
FIG. 1 is a schematic structural diagram of a touch control structure layer.

| 10 first touch control electrode | 11 first connecting part | 20 second touch control electrode |
|---|---|---|
| 21 second connecting part | 30 cuts | 50 pixel unit |
| 51 first subpixel | 52 second subpixel | 53 third subpixel |
| 54 fourth subpixel | 61 flexible substrate | 62 driving circuit layer |
| 63 light-emitting structure layer | 64 encapsulation layer | 100 Bulk region |
| 101 first touch control unit | 102 first transmission line | 103 first bonding pad electrode |
| 200 Boundary region | 201 second touch | 202 second transmission |

| | control unit | line |
|---|---|---|
| 203 second bonding pad electrode | 300 Bridge region | 301 connecting mesh |
| 302 connecting bridge | 303 bonding pad part | 304 second connecting wire |
| 305 first connecting unit | 306 second connecting unit | 307 metal wire-free region |
| 308 first connecting wire | 700 display structure layer | 701 subpixel |
| 702 subpixel horizontal boundary | 703 subpixel vertical boundary | 800 touch control structure layer |
| 801 mesh pattern unit | 802 horizontal metal wire | 803 vertical metal wire |
| 901 first horizontal cut | 902 second horizontal cut | 903 first vertical cut |
| 904 second vertical cut. | | |

DETAILED DESCRIPTION

To make the purpose, technical solution and the advantages of the present disclosure clearer and more comprehensible, the embodiments will be described below in details in combination with the drawings. The implementations in the present disclosure can be carried out in various forms. A person of ordinary skills in the art will readily understand the fact that implementations and contents can be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined randomly.

In the drawings, the size of a constituent element, the thickness and area of a layer are sometimes exaggerated for clarity. Therefore, any implementation of the present disclosure is not necessarily limited to the sizes shown in the drawings, and the shapes and sizes of components in the drawings do not reflect the true scale. In addition, the drawings schematically show ideal examples, and none of the implementations of the present disclosure is limited to the shapes or values shown in the drawings.

The "first", "second", "third" and other ordinal numbers in the present specification are used to avoid confusion of constituent elements, not to define the quantity.

In this description, for the sake of convenience, the words of direction and locations like "middle", "upper", "lower", "front", "rear", "vertical", "horizontal", "top", "bottom", "inner" and "outer" are used to indicate the positional relationship of the constituent elements with reference to the drawings. These words are only used for an easy and simplified description of the implementations, rather than for indicating or implying that the device or components have to be disposed in a particular position or direction or have to be constructed or operated in a particular position or direction and thus, these words should be not construed as any limit to the present disclosure. The positional relationship of the constituent elements can be appropriately changed according to the direction of the described constituent elements. Therefore, the above words describing positional relations are not limited to those in the present disclosure and can be replaced according to specific circumstances.

In the present description, the terms "installed", "connected" and "coupled" shall be understood in their broadest sense unless otherwise explicitly prescribed and defined. For example, "coupled" can mean fixedly coupled, removably coupled, or integrally coupled; it can also mean mechanically coupled, or electrically coupled; it can mean directly coupled, indirectly coupled via a middleware or coupled via internal communication. Those of ordinary skill in the art can understand the specific meaning of the above mentioned terms in the present disclosure on a case by case basis.

In the present description, a transistor refers to an element that includes at least three terminals: a gate electrode, a drain electrode, and a source electrode. The transistor has a channel region between the drain electrode (also referred to as drain electrode terminal, drain region or drain electrode) and the source electrode (also referred to as source electrode terminal, source region or source electrode), and current can flow through the drain electrode, the channel region and the source electrode. In the present disclosure, the channel region refers to a region through which current mainly flows.

In the present description, the first electrode may be a drain electrode and the second electrode may be a source electrode, or the first electrode may be a source electrode and the second electrode may be a drain electrode. The functions of the "source electrode" and that of the "drain electrode" are interchangeable when transistors with opposite polarities are used or when the current direction changes during circuit operation. Therefore, the "source electrode" and the "drain electrode" are interchangeable in the present disclosure.

In the present description, "electrically coupled" includes the case where the constituent elements are coupled via an element having certain electrical function. The "element with certain electrical function" is not particularly limited as long as it is capable of transmitting and receiving electrical signals between coupled components. The "element with certain electrical function" can be, for example, an electrode, a wiring, a switching element such as a transistor, a resistor, an inductor, a capacitor or other elements with various functions.

In the present description, "parallel" refers to a state in which two straight lines form an angle larger than −10° but smaller than 10° and thus, can refer to a state in which the angle is larger than −5° but smaller than 5°. In addition, "perpendicular" refers to a state in which two straight lines form an angle larger than 80° but smaller than 100° and thus, can refer to a state in which the angle is larger than 85° but smaller than 95°.

In the present description, "film" and "layer" are interchangeable. For example, sometimes "conductive layer" can be replaced by "conductive film". Similarly, sometimes the "insulating film" can be replaced by "insulating layer".

In the present description, "about" means that there is not strict limit for a value, and values within an error range during processes and measurement are allowed.

The display panel in the present disclosure includes a display structure layer disposed on a substrate and a touch control structure layer disposed on the display structure layer. The display structure layer may be a liquid crystal display (LCD) structure layer, an organic light emitting diode (OLED) structure layer, a plasma display panel (PDP) structure layer, or an electrophoretic display (EPD) structure layer. In an exemplary embodiment, the display structure layer is an OLED structure layer including a substrate, a driving circuit layer disposed on the substrate, a light emitting structure layer disposed on the driving circuit layer, and an encapsulation layer disposed on the light emitting structure layer. The touch control structure layer is disposed on the encapsulation layer of the display structure layer to form a structure of Touch on Thin film Encapsulation (Touch on TFE for short).

FIG. 1 is a schematic structural diagram of a touch control structure layer. As shown in FIG. 1, the touch control structure layer includes a plurality of first touch control units 101 and a plurality of second touch control units 201, wherein the first touch control units 101 have a line shape extending along the direction of a first extending direction D1 and the plurality of the first touch control units are disposed in sequence along a second extending direction D2. The second touch control units 201 have a line shape extending along the direction of the second extending direction D2 and the plurality of the second touch control units 201 are disposed in sequence along the first extending direction D1, and wherein the first extending direction D1 intersects with the second extending direction D2.

Each first touch control unit 101 includes a plurality of first touch control electrodes 10 and a first connecting part 11 sequentially disposed along the first extending direction D1, and the plurality of the first touch control electrodes 10 and the first connecting part 11 are alternately disposed and orderly coupled. Each second touch control unit 201 includes a plurality of second touch control electrodes 20 sequentially disposed along the second extending direction D2, and the plurality of second touch control electrodes 20 are arranged at intervals wherein the adjacent second touch control electrodes 20 are coupled via second connecting portions 21. The second connecting parts 21 are disposed on a different layer from the layers that the first touch control electrodes 10 and the second touch control electrodes 20 are disposed on. The first touch control electrodes 10 and the second touch control electrodes 20 are alternately disposed along a third extending direction D3, the third extending direction D3 intersects with the first extending direction D1 and the second extending direction D2.

Each first touch control unit 101 is coupled to a first bonding pad electrode 103 via a first transmission line 102, and each second touch control unit 201 is coupled to a second bonding pad electrode 203 via a second transmission line 202. In an exemplary embodiment, the first touch control electrodes 10 are coupled to a driver of the display panel via first bonding pad electrodes 103, and the second touch control electrodes 20 are coupled to the driver via second bonding pad electrodes 203, wherein the driver applies driving signals to the second touch control electrodes 20 and receives output signals from the first touch control electrodes 10, or applies driving signals to the first touch control electrodes 10 and receives output signals from the second touch control electrodes 20. The driver can determine the location where a touch occurs by detecting the inductive signals generated in the plurality of electrodes when different electrodes transmit touch signals.

In an exemplary embodiment, the plurality of first touch control electrodes 10, the plurality of second touch control electrodes 20 and the plurality of first connecting parts 11 can be disposed on the same layer of the touch control layer and can be formed simultaneously by a patterning process. The first touch control electrodes 10 and the first connecting parts 11 can be coupled as an integrated structure and the second connecting parts 21 can be disposed on the bridge layer and connect the adjacent second touch control electrodes 20 through via holes. An insulating layer is provided between the touch control layer and the bridge layer. In some possible implementations, a plurality of first touch control electrodes 10, a plurality of second touch control electrodes 20 and a plurality of second connecting parts 21 can be arranged on the same layer of the touch layer, wherein the second touch control electrodes 20 and the second connecting parts 21 can be coupled as an integrated structure. The first connecting parts 11 can be disposed on the bridge layer and connect adjacent first touch control electrodes 10 through via holes. In an exemplary embodiment, the first touch control electrodes may be driving electrodes (Tx) and the second touch control electrodes may be sensing electrode (Rx); or the first touch control electrodes may be sensing electrodes (Rx) and the second touch control electrodes may be driving electrode (Tx).

In an exemplary embodiment, the first touch control electrodes 10 and the second touch control electrodes 20 may have rhombic shapes, such as regular rhombic shapes, horizontally long rhombic shapes, or longitudinally long rhombic shapes. In some possible implementations, the first touch control electrode 10 and the second touch control electrode 20 may have any one or more of the shapes of triangles, squares, trapezoids, parallelograms, pentagons, hexagons and other polygons, which is not limited in the present disclosure.

In an exemplary embodiment, the first touch control electrodes 10 and the second touch control electrodes 20 may be in the form of a metal mesh. The metal mesh is formed by a plurality of interweaving metal wires and includes a plurality of mesh pattern units, the mesh pattern units are polygons formed with a plurality of metal wires. The formed first touch control electrodes 10 and the second touch control electrodes 20 with the layout of metal mesh have the advantages of low resistance, less thickness, fast response speed and the like. In an exemplary embodiment, the region formed by metal wires in a mesh pattern unit contains the region of subpixels in the display structure layer, and the metal wires are located between adjacent subpixels. For example, when the display structure layer is an OLED display structure layer, the subpixels region can be the light-emitting region defined by a pixel define layer in the light-emitting structure layer. The region enclosed by the metal wires of each mesh pattern unit contains the light-emitting region, and the metal wires are located in the corresponding positions on the pixel definition layer, i.e., in the non-light-emitting region.

Figures 1, 2:
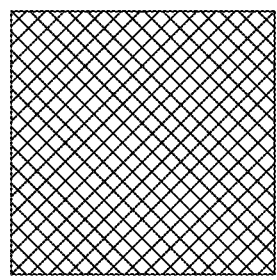
Figure 2:
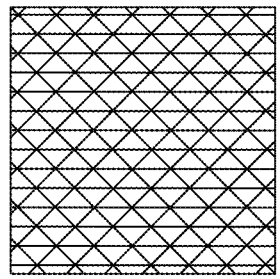
Figures 2, 3:
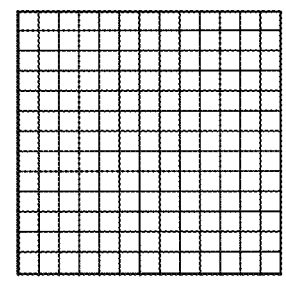
Figures 2, 3, 4:
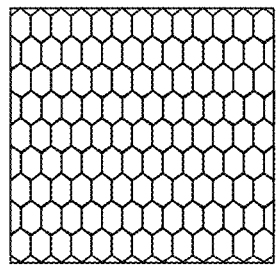

FIGS. 2-1 to 2-5 are schematic diagrams of several types of metal meshes. As shown in FIG. 2, the metal mesh includes a plurality of mesh pattern units, and the mesh pattern units are polygons formed with metal wires. In other words, the metal mesh is formed by splicing of mesh pattern units which are repeatedly and continuously arranged. In an exemplary embodiment, the shape of a mesh pattern unit formed by metal wires can be rhombic, as shown in FIG. 2-1. Or, the shape of a mesh pattern unit formed by metal wires can be triangular, as shown in FIG. 2-2. Or, the shape of a mesh pattern unit formed by metal wires can be rectangular, as shown in FIG. 2-3. Or, the shape of a mesh pattern unit formed by metal wires can be hexagonal, as shown in FIG. 2-4. Or, the shape of a mesh pattern unit formed by metal wires can be a combination of various shapes, such as a combination of pentagons and hexagons, as shown in FIG. 2-5. Or, the shape of a mesh pattern unit formed by the metal wires can include any one or more of a triangle, a square, a rectangle, a rhombus, a trapezoid, a pentagon and a hexagon. In some possible implementations, the shape of a mesh pattern unit formed by metal wires can be regular or irregular, and the sides a mesh pattern unit can be straight lines or curves, to which this disclosure does not provide any limit. In some possible implementations, the line width of the metal wires is ≤5 μm.

FIG. 3 is a schematic structural diagram of a touch control structure layer in the form of metal mesh, which is an enlarged view of Region A in FIG. 1, and the mesh pattern unit is rhombic. As shown in FIG. 3, in order to insulate the first touch control electrodes 10 from the second touch control electrodes 20, the metal mesh is provided with a plurality of cuts 30 which disconnect the metal wires of the mesh pattern units, thus implementing the isolation of the mesh pattern units of the first touch control electrodes 10 from the mesh pattern units of the second touch control electrodes 20. In FIG. 3, a black block is used to represent a cut 30, which can be understood as an imaginary line cutting a metal wire. In an exemplary embodiment, the plurality of cuts 30 constitute a Bulk region (touch region) 100 of the metal mesh, a Boundary region 200 and a Bridge region 300. Each mesh pattern unit located in the Boundary region 200 is provided with a cut disconnecting the metal wires of mesh pattern unit, so that each mesh pattern unit is divided into two parts with one part belonging to the first touch control electrodes 10 and the other part belonging to the second touch control electrodes 20, or one part belonging to the second touch control electrodes 20 and the other part belonging to the first touch control electrodes 10. In an exemplary embodiment, the Bridge region 300 includes a first connecting part for connecting two first touch control electrodes 10 and a second connecting part for connecting two second touch control electrodes 20.

In an exemplary embodiment, the Bulk region 100 is also provided with a plurality of cuts (not shown in the drawings) which form one or more Dummy regions in the Bulk region. The Bulk region on one side of the Boundary region includes a first touch control electrode and a Dummy region, and the Bulk region on the other side of the Boundary region includes a second touch control electrode and a Dummy region. In an exemplary embodiment, the Bridge region 300 is also provided with a plurality of cuts (not shown in the drawings) which implement the isolation and connection of related mesh pattern units.

FIG. 4 is a schematic structural diagram of a plan of a display structure layer. Horizontally, the display structure unit includes a plurality of pixel units arranged orderly. In an exemplary embodiment, each pixel unit may include 3 subpixels, or may include 4 subpixels, or may include a plurality of subpixels. When the pixel unit includes three subpixels, the three subpixels include a first subpixel emitting light of the first color, a second subpixel emitting light of the second color and a third subpixel emitting light of the third color. When the pixel unit includes four subpixels, the four subpixels include a first subpixel emitting light of the first color, a second subpixel emitting light of the second color, a third subpixel emitting light of the third color and a fourth subpixel emitting light of the fourth color. As an exemplary illustration, FIG. 4 shows that the pixel unit 50 includes four subpixels, namely, a first subpixel 51, a second subpixel 52, a third subpixel 53 and a fourth subpixel 54, which are all square and are arranged in the form of a square. In an exemplary embodiment, the first subpixel 51 and the fourth subpixel 54 are green subpixels emitting green (G) light, the second subpixel 52 is a red subpixel emitting red (R) light, and the third subpixel 53 is a blue subpixel emitting blue (B) light, which form a pixel unit 50 of the arrangement of an RGGB square. In some possible implementations, the first subpixel 51 may be a green subpixel, the second subpixel 52 may be a red subpixel, the third subpixel 53 may be a blue subpixel, and the fourth subpixel 54 may be a white (W) subpixel, which form a pixel unit 50 of the arrangement of an RGBW square. In some possible implementations, a pixel unit may include a red subpixel, a green subpixel, a blue subpixel, a cyan subpixel, a magenta subpixel, a yellow subpixel and a white subpixel.

Figures 2, 3, 4, 5:
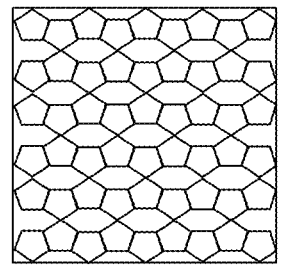
Figure 3:
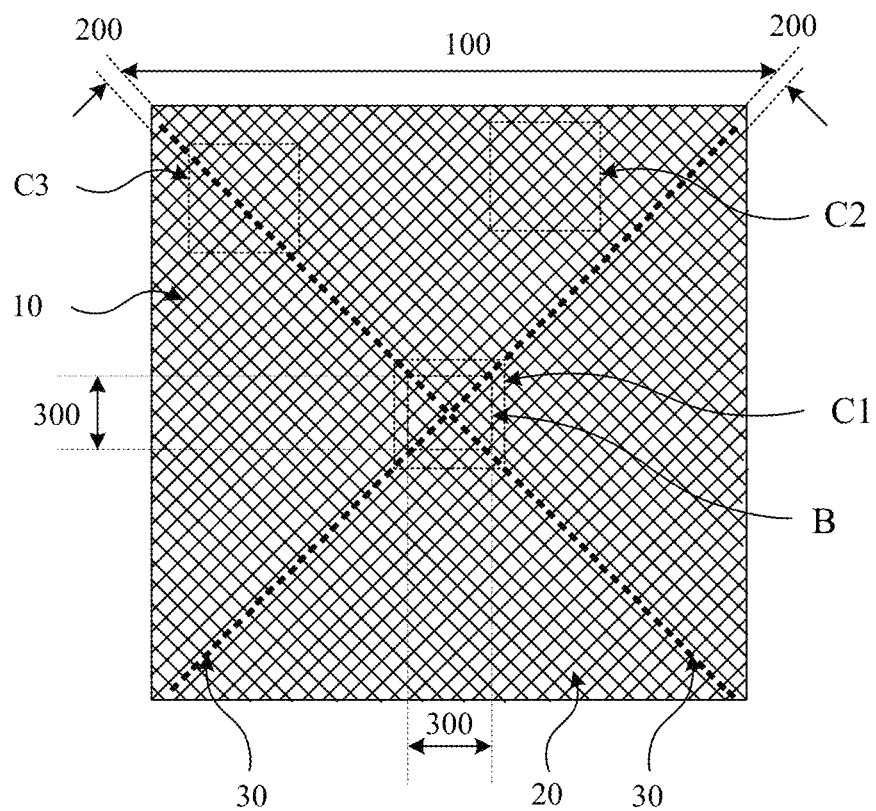
Figure 4:
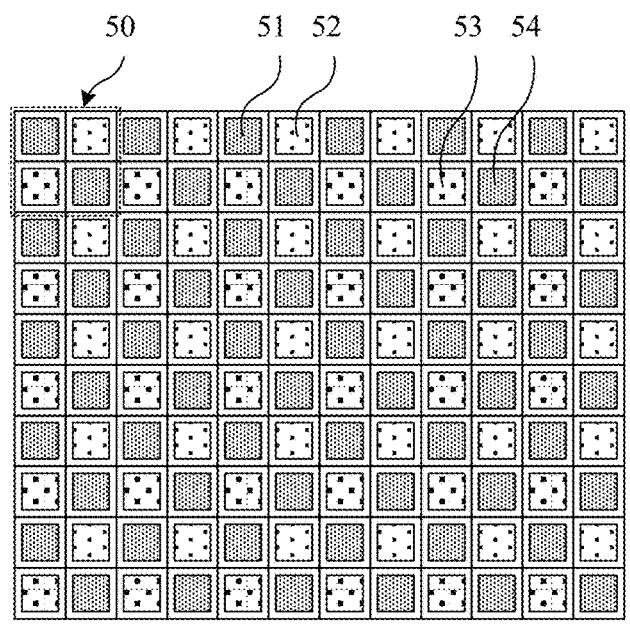
Figures 1, 5:
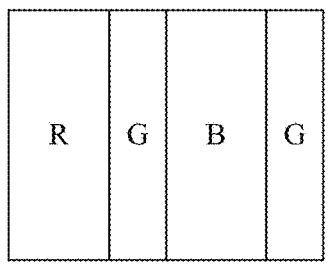
Figures 2, 5:
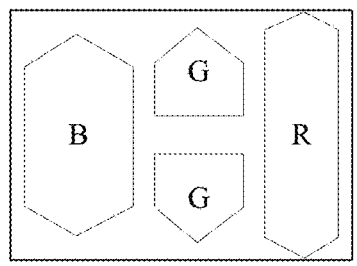
Figures 3, 5:
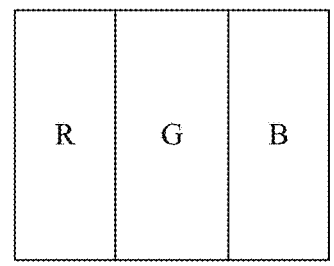

In an exemplary embodiment, the four subpixels included in the pixel unit 50 can be in various shapes and arranged in various of forms. FIGS. 5-1 to 5-3 are schematic structural diagrams of several pixel units. The four subpixels can be rectangular and arranged side by side in an order of an R subpixel, a G subpixel, a B subpixel and a G subpixel from left to right, as shown in FIG. 5-1. Alternatively, the four subpixels can be pentagons or hexagons arranged side by side, as shown in FIG. 5-2. In an exemplary embodiment, when the pixel unit 50 includes three subpixels, the three rectangular subpixels may be arranged side by side in the horizontal direction or in the vertical direction as shown in FIG. 5-3. In some possible implementations, the shape of subpixels may be any one or more of triangle, square, rectangle, rhombus, trapezoid, parallelogram, pentagon, hexagon and other polygons and the subpixels may be arranged in form of X-shape, cross shape, T shape or the like, to which this disclosure does not provide any limit.

Figure 6:
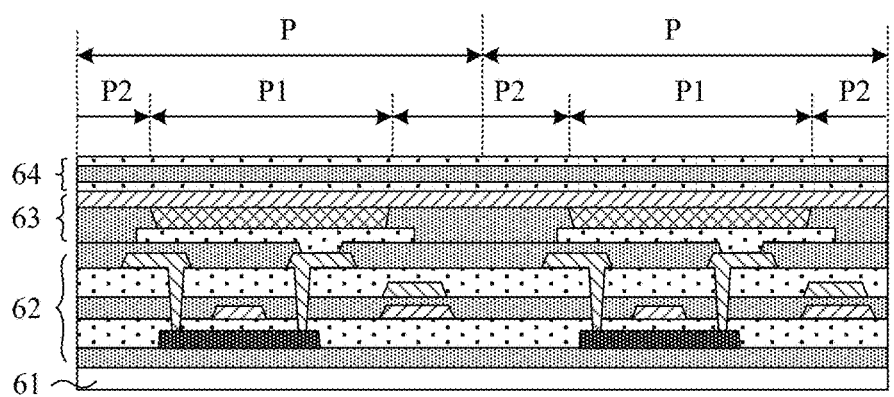
FIG. 6 is a schematic structural diagram of a cross section of a display structure layer.

FIG. 6 is a schematic structural diagram of a cross section of a display structure layer, illustrating the structure of two subpixels in an OLED display. As shown in FIG. 6, vertically, the display structure layer includes a driving circuit layer 62 disposed on a flexible substrate 61, a light emitting structure layer 63 disposed on the driving circuit layer 62, and an encapsulation layer 64 disposed on the light emitting structure layer 63. When the display panel of the present disclosure is formed, the touch control structure layer is disposed on the encapsulation layer 64. In some possible implementations, the display structure layer may comprise other film layers and other film layers may also be disposed between the touch control structure layer and the encapsulation layer, to which this disclosure does not provide any limit.

In an exemplary embodiment, the flexible substrate 61 may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer can be amorphous silicon (a-si).

In an exemplary embodiment, the driving circuit layer 62 may include a transistor and a storage capacitor constituting a pixel driving circuit, an example of which is illustrated in FIG. 6 where each subpixel includes a transistor and a storage capacitor. In some possible implementations, the driving circuit layer 62 of each subpixel may comprise a first insulating layer disposed on a flexible substrate, an active layer disposed on the first insulating layer, a second insulating layer covering the active layer, a gate electrode and a first capacitor electrode disposed on the second insulating layer, a third insulating layer covering the gate electrode and the first capacitor electrode, a second capacitor electrode disposed on the third insulating layer, and a fourth insulating layer covering the second capacitor electrode. The fourth insulating layer is provided with via holes which expose the active layer. And a source electrode and a drain electrode disposed on the fourth insulating layer are respectively coupled with the active layer through the via holes to cover the planarization layer of the aforementioned structure. The active layer, the gate electrode, the source electrode and the drain electrode constitute a transistor, and the first capacitor electrode and the second capacitor electrode constitute a storage capacitor. In some possible implementations, the first insulating layer, the second insulating layer, the third insulating layer and the fourth insulating layer may adopt any one or more of silicon oxide (SiOx), silicon nitride (SiNx) and silicon oxynitride (SiON), and may be single-layered, multi-layered or composite. The first insulating layer can be referred to as Buffer layer and used to improve the water-resistance and oxygen-resistance of the substrate. The second and third insulating layers can be referred to as Gate Insulating (GI) layer, and the fourth insulating layer can be referred to as Inter-Layer Insulating (ILD) layer. The first metal thin film, the second metal thin film and the third metal thin film may adopt metals such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb) and the films can be of single-layered structure or multi-layered composite structure, for example Ti/Al/Ti etc. The active layer thin film may use materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, or the like, that is, the present disclosure is applicable to transistors manufactured based on an Oxide technology, a silicon technology and an organic technology.

In an exemplary embodiment, the light-emitting structure layer 63 may comprise an anode, a pixel definition layer, an organic light-emitting layer and a cathode. The anode is provided on a planarization layer and is connected with a drain electrode through a via hole formed in the planarization layer. The pixel define layer is provided on the anode and the planarization layer which is provided with a pixel opening. The pixel opening exposes the anode and in the pixel opening, the organic light-emitting layer is provided. The cathode is provided on the organic light-emitting layer, and the organic light-emitting layer emits light of corresponding colors under the action of voltages applied by the anode and cathode.

In an exemplary embodiment, the encapsulation layer 64 may include a first encapsulation layer, a second encapsulation layer and a third encapsulation layer which are stacked. The first encapsulation layer and the third encapsulation layer may be made of inorganic materials while the second encapsulation layer may be made of organic materials. The second encapsulation layer is disposed between the first encapsulation layer and the third encapsulation layer to ensure that external moisture cannot enter the light emitting structure layer 63.

In an exemplary embodiment, the display structure layer includes a light-emitting region and a non-light-emitting region. As shown in FIG. 6, since the organic light-emitting layer emits light through the pixel opening region limited by the pixel definition layer, the pixel opening region is a light-emitting region P1, and the region other than the pixel opening region is a non-light-emitting region P2, which is located at the periphery of the light-emitting region P1. In an exemplary embodiment of the present disclosure, each light-emitting region P1 is called a subpixel, such as a red subpixel, a blue subpixel or a green subpixel, and each non-light-emitting region P2 is called a subpixel boundary, such as a red-green subpixel boundary between a red and a green subpixel, and a blue-green subpixel boundary between a blue and a green subpixel. In this way, the light-emitting region of the display structure layer includes a plurality of periodically-arranged subpixels, and the non-light-emitting region of the display structure layer includes subpixel boundaries between adjacent subpixels.

Figures 1, 7:
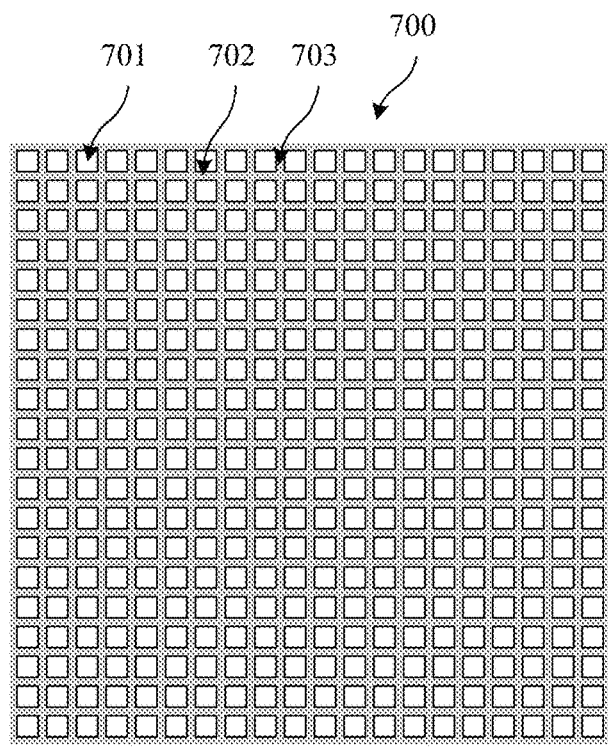
Figures 2, 7:
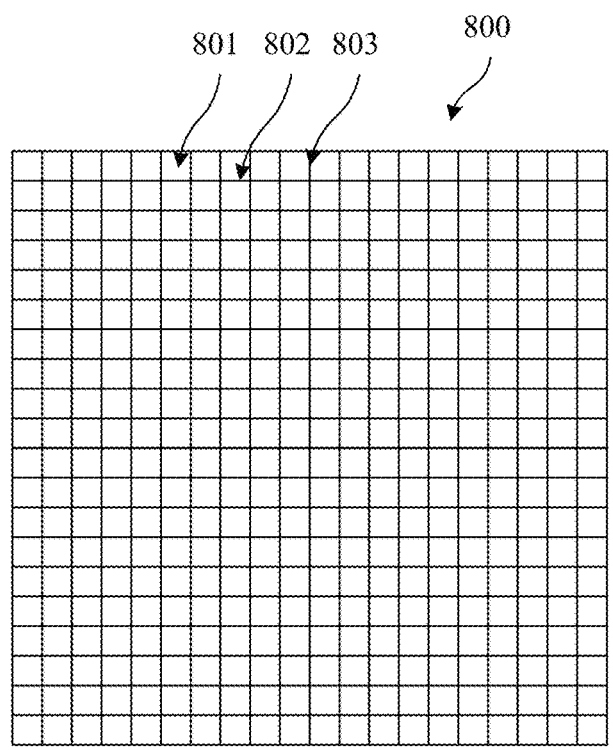
Figures 3, 7:
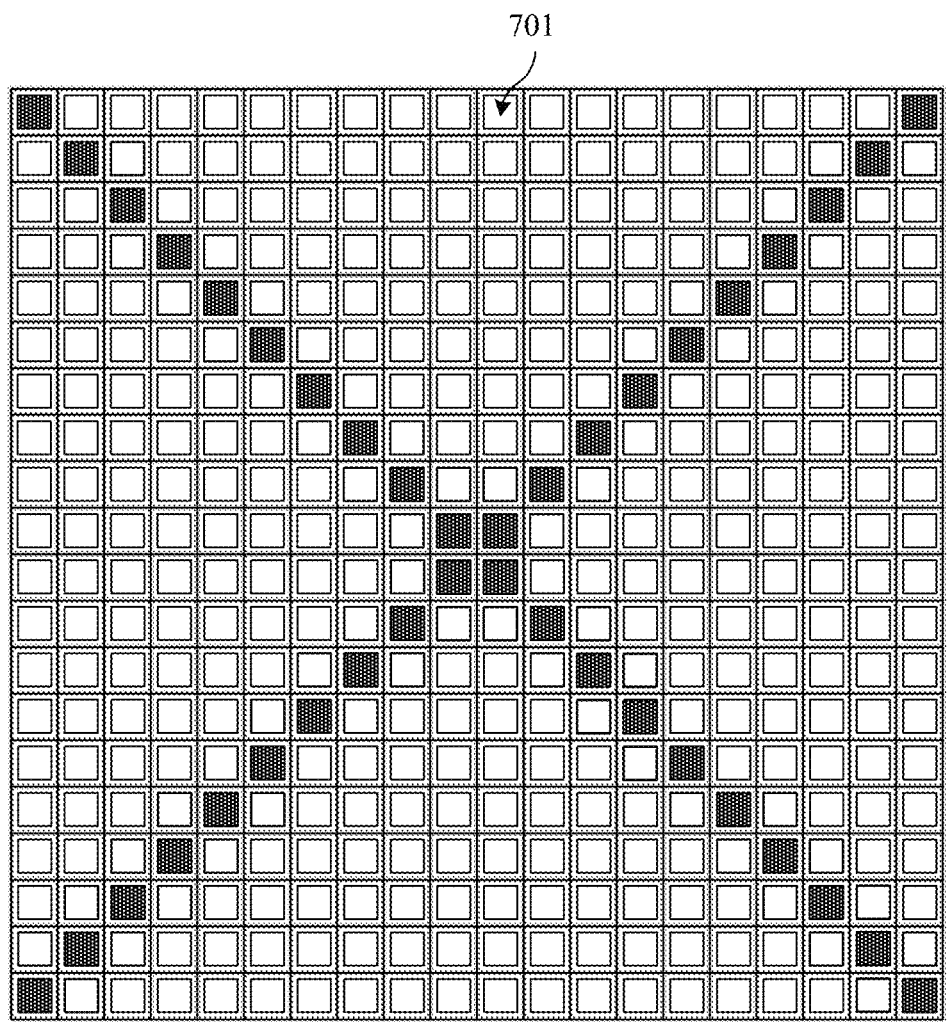

FIGS. 7-1 to 7-3 are schematic structural diagrams of display panels according to an exemplary embodiment of the present disclosure. The display panel includes a display structure layer 700 and a touch control structure layer 800 which are stacked on a substrate. In this example, the display structure layer 700 includes a first subpixel, a second subpixel, a third subpixel and a fourth subpixel arranged periodically, and the four square subpixels are arranged in the form of a square, as shown in FIG. 7-1. FIG. 7-1 illustrates 20 rows of subpixels and 20 columns of subpixels, which is 20*20 subpixels 701, multiple horizontal subpixel boundaries 702 between adjacent subpixel rows which extend along the horizontal direction and multiple vertical subpixel boundaries 703 between adjacent subpixel columns which extend along the vertical direction. In this example, the touch control structure layer 800 includes a first mesh pattern unit, a second mesh pattern unit, a third mesh pattern unit and a fourth mesh pattern unit which are arranged periodically. As shown in FIG. 7-2, the first mesh pattern unit may have the same shape as the first subpixel; the second mesh pattern unit may have the same shape as the second subpixel; the third mesh pattern unit may have the same shape as the third subpixel; fourth mesh pattern unit may have the same shape as the fourth subpixel. FIG. 7-2 illustrates a 20*20 mesh pattern consisting of 20 rows of mesh pattern units and 20 columns of mesh pattern units. The 20*20 mesh pattern 801 is formed by perpendicular intersections of a plurality of horizontal metal wires 802 and a plurality of vertical metal wires 803. In an exemplary embodiment, each 20*20 mesh pattern may be referred to as a repeating unit. FIG. 7-3 is a schematic diagram illustrating that the disposition of touch control structure layer 800 on the display structure layer 700. As shown in FIG. 7-3, when the touch control structure layer is disposed on the display structure layer, positions of the 20*20 mesh pattern units 801 in the touch control structure layer 800 coincide with the positions of the 20*20 subpixels 701 in the display structure layer 700, that is, the position of the first mesh pattern unit coincides with that of the first subpixel; the position of the second mesh pattern unit coincides with that of the second subpixel; the position of the third mesh pattern unit coincides with that of the third subpixel; and the position of the fourth mesh pattern unit coincides with that of the fourth subpixel. The positions of the plurality of horizontal metal wires 802 in touch control structure layer 800 coincide with the positions of the plurality of subpixel horizontal boundaries 702 in display structure layer 700; the positions of the plurality of vertical metal wires 803 in touch control structure layer 800 coincide with the positions of the plurality of subpixel vertical boundaries 703 in display structure layer 700. The orthographic projection of subpixel horizontal boundary 702 on the substrate contains the orthographic projection of the horizontal metal wires 802 on the substrate, and the orthographic projection of subpixel vertical boundary 703 on the substrate contains the orthographic projection of the vertical metal wires 803 on the substrate. In this way, the region formed by the orthographic projections of the metal wires on the substrate contains the orthographic projection of at least one subpixel on the substrate. In an exemplary embodiment of this disclosure, "the orthographic projection of A contains the orthographic projection of B" means that the orthographic projection of B located within the orthographic projection of A, that is, the boundaries of the orthographic projection of B are within the boundaries of the orthographic projection of A, or the boundaries of the orthographic projection of B coincide with boundaries of the orthographic projection of A. In the display panel formed in this way, the metal wires in the touch control structure layer 800 are all arranged within the non-light-emitting subpixel boundaries region in the display structure layer 700, and the metal wires do not cross the light-emitting region of the emitted light. When the display panel displays a dark picture or when the ambient light is strong, the metal mesh will not be observed by naked eyes and the display effect will not be affected. In some possible implementations, the mesh pattern unit may be of different shape from the subpixel, to which the present disclosure does not provide any limit.

In an exemplary embodiment, a plurality of cuts are provided on a plurality of mesh pattern units of the touch control structure layer 800. The plurality of cuts disconnect the metal wires of the mesh pattern units so that the touch control structure layer 800 forms a Bulk region (touch region), a Boundary region and a Bridge region. As shown in FIG. 7-3, the mesh pattern units to which the subpixels 701 at non-colored filling location correspond are the Bulk region, and the mesh pattern units to which the subpixels 701 at dark filling location correspond to are the X-shaped Boundary region. The overlapping region in the center of the X-shape is the Bridge region. The Bulk regions includes first touch control electrodes and second touch control electrodes, and the Boundary region is disposed between the adjacent first touch control electrodes and the second touch control electrodes, and a plurality of cuts are provided on a plurality of mesh pattern units of the Boundary region to disconnect the metal wires of the mesh, so that the adjacent first touch control electrodes and the second touch control electrodes are insulated. Among the four Bulk regions separated by the X-shaped Boundary region, the upper and lower Bulk regions may be the first touch control electrodes while the left and right Bulk regions may be the second touch control electrodes or the upper and lower Bulk regions may be the second touch control electrodes while the left and right Bulk regions may be the first touch control electrodes.

Figures 1, 8:
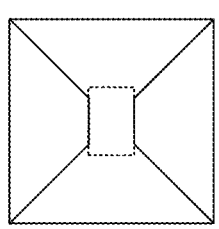
Figures 2, 8:
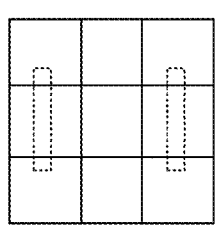
Figures 3, 8:
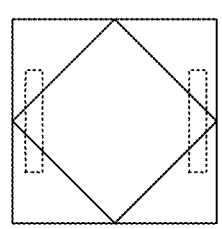
Figures 4, 8:
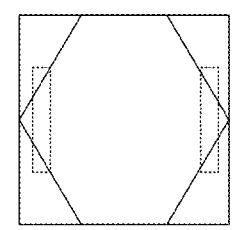

FIG. 8-1 to FIG. 8-4 are schematic diagrams of several types of Bulk region, Boundary region, and Bridge region, illustrating the shapes of the Bulk region, the Boundary region, and the Bridge region in a touch control unit, in which the area marked with solid lines represent Boundary regions and the dashed area represent Bridge regions. In an exemplary embodiment, the Bulk regions can be triangular and the Boundary region can be X-shaped, as shown in FIG. 8-1. Alternatively, the Bulk regions can be rectangular and the Boundary region can be in a shape of hash sign ("#"), as shown in FIG. 8-2. Alternatively, the Bulk regions can be rhombic and the Boundary region can be rhombic, as shown in FIG. 8-3. Alternatively, the Bulk regions can be hexagonal and the Boundary region can be hexagonal, as shown in FIG. 8-4. In some possible implementations, the Bulk region can be any one or more of a triangle, a square, a rectangle, a rhomb, a trapezoid, a parallelogram, a pentagon, and a hexagon while the Boundary region can be any one or more of X-shaped, hash-shaped, cross-shaped, square, rectangular, rhombic, parallelogramic, and hexagonal, which is not limited in the present disclosure.

Figures 1, 2, 9:
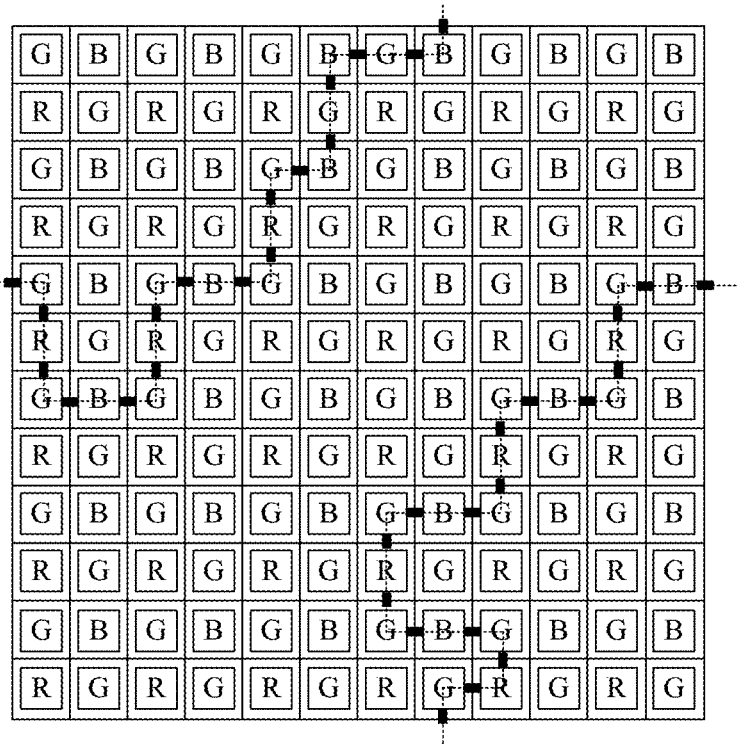

When the touch control structure layer and the display structure layer are stacked, the Bridge region of the touch control structure layer may show mura defects, which can be represented as dot-shaped, line-shaped or block-shaped marks in the dark state and as brightness attenuation difference in different azimuth angles in the bright state. FIG. 9-1 to FIG. 9-2 are schematic diagrams of the mura defects of the Bridge region. FIG. 9-1 illustrates the cut arrangement of 12*12 mesh pattern units in the Bridge region, through disconnecting the metal wires by a plurality of the cuts, the whole region is separated into corresponding regions. However, such a cut arrangement will make the mura defects of the Bridge region prominent and visible to the naked eyes, as shown by FIG. 9-2.

Figures 1, 10:
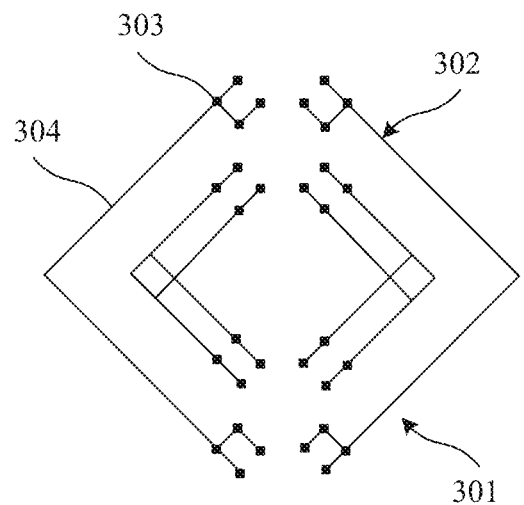
Figures 2, 10:
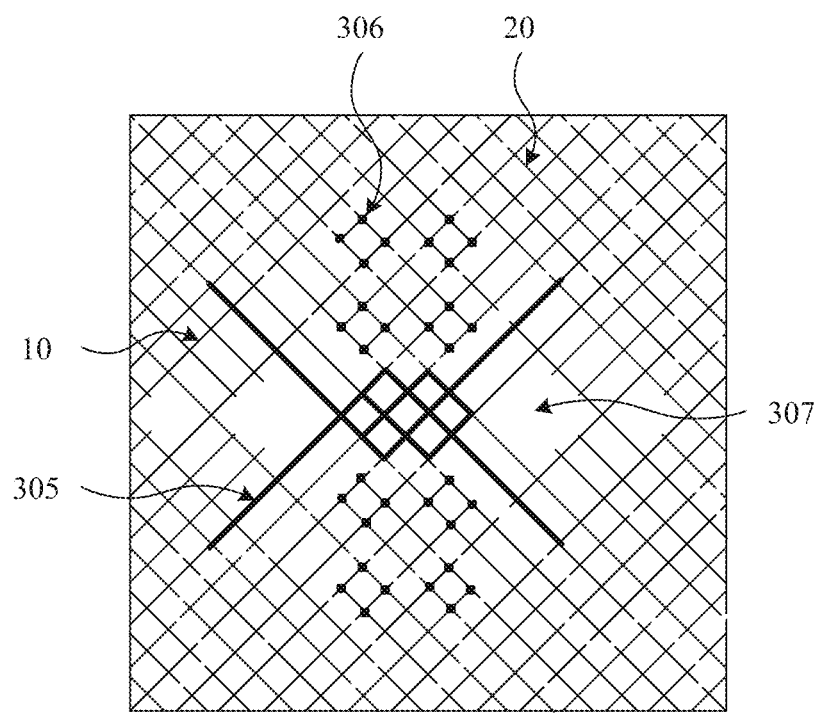
Figures 3, 10:
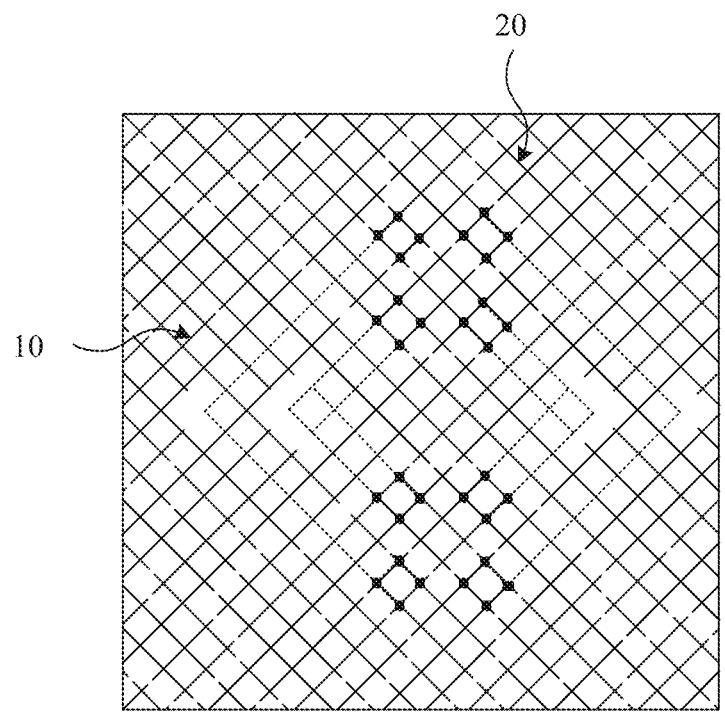

FIG. 10-1 to FIG. 10-3 are schematic structural diagrams of a metal mesh in the Bridge region, which are a lager image of B region in FIG. 3, and the mesh pattern unit is rhombic. In a direction vertical to the touch control structure layer, the touch control structure layer includes a bridge layer, an insulating layer and a touch layer which are sequentially arranged along the direction away from the display structure layer, wherein the insulating layer is arranged between the touch layer and the bridge layer so as to insulate the two layers from each other. In an exemplary embodiment, the bridge layer includes a lower layer metal mesh and the touch control layer includes an upper layer metal mesh. The metal mesh in the Bridge region includes the lower layer metal mesh disposed on the bridge layer and the upper layer metal mesh disposed on the touch control layer, wherein the lower layer metal mesh serves as a connecting bridge and is configured to enable the second touch control electrodes 20 disposed on the touch control layer to connect to each other, and the upper metal mesh is configured enable the first touch control electrodes 10 disposed on the same layer to connect to each other.

FIG. 10-1 is a schematic structural diagram of the lower layer metal mesh disposed on the bridge layer, the lower layer metal mesh is served as a connecting bridge for establishing connecting among the second touch control electrodes 20 arranged at intervals along the vertical direction. As seen in FIG. 10-1, the lower layer metal mesh includes two connecting meshes 301 arranged symmetrically relative to a vertical line, each connecting mesh 301 comprises a plurality of connecting bridges 302, and each connecting bridge includes bonding pad parts 303 and second connecting wire 304. Bonding pad parts 303 are disposed at both ends of the connecting bridge 302 and are configured to be connected with the second touch control electrode 20 located on the touch control layer through via holes opened in the insulating layer. Second connecting wires 304 are disposed between the bonding pad parts 30 at both ends and configured to connect the bonding pad portions 303 at both ends. The second connecting wires 304 includes one second connecting wire coupled to the bonding pad part 303 on the first side of the connecting bridge 302 and the other second connecting wire coupled to the bonding pad part 303 on the second side of the connecting bridge 302, wherein one of the second connecting wires extends from the bonding pad part 303 on the first side to the bonding pad 303 on the second side while the other second connecting wire extends from the bonding pad part 303 on the second side to the bonding pad part 303 on the first side, and thus the two second connecting wires are coupled to each other at their intersection. In an exemplary embodiment, each connecting mesh 301 includes 2-5 connecting bridges 302 arranged in sequence, wherein the connecting bridges 302 with the same shape are arranged in the way that the smaller ones are enclosed by the larger ones. In an exemplary embodiment, each connecting bridge may include a plurality of interconnected mesh structures. In an exemplary embodiment, each bonding pad part 303 at the end of the connecting bridge 302 includes 2 to 4 first pads, and a plurality of first pads are arranged to form a shape like a line, a triangle or a square. In an exemplary embodiment, the second connecting wires 304 in a broken line are coupled respectively to the first pads in the bonding pad parts 303 at both ends.

FIG. 10-2 is a schematic structural diagram of an upper metal mesh arranged on the touch control layer. As shown in FIG. 10-2, the upper metal mesh includes first touch control electrodes 10, second touch control electrodes 20, a first connecting unit 305 and a second connecting unit 306, wherein, the first touch control electrodes 10 are arranged at intervals along the horizontal direction. As a first connecting part, the first connecting unit 305 connects two adjacent first touch control electrodes 10. The second touch control electrodes 20 are arranged at intervals in the vertical direction, and the second connecting unit 306 and the lower layer metal mesh together serve as a second connecting part to connect two adjacent second touch control electrodes 20. The first connecting unit 305 includes a plurality of intersecting wires, as shown by the bold lines in FIG. 10-2. The plurality of intersecting wires intersect with each other and extend respectively toward the direction of the two first touch control electrodes 10, so that the two adjacent first touch control electrodes 10 and the first connecting unit 305 are formed an integrated structure with connecting to each other. The line width of the actual intersecting wires is the same as that of the metal wires of the metal mesh, and the lines being illustrated in bold in FIG. 10-2 is only to describe them clearly. The second connecting unit 306 includes a plurality of second bonding pads with positions corresponding to the positions of the first bonding pads on the lower layer metal mesh, and are configured to be coupled to the lower layer metal mesh disposed on the bridge layer through the via holes opened on the insulating layer. A plurality of second bonding pads are respectively located on the two sides of the first connecting unit 305, and the second bonding pads of each side are coupled to the second touch control electrodes 20 on the same side.

In one arrangement of the metal mesh in Bridge region, the positions of the second bonding pads of the upper layer metal mesh are in one-to-one correspondence to the positions of the first bonding pads of the lower layer metal mesh. Second connecting wires 304 are disposed among the plurality of first bonding pads of the lower layer metal mesh, and metal wires in the upper layer metal mesh with positions corresponding to the second connecting wires 304 are removed to form a metal wire-free region 307, as shown FIG. 10-2.

FIG. 10-3 a schematic structural diagram of metal mesh in Bridge region, illustrating the metal wires of upper layer metal mesh with solid lines and the metal wires of lower layer metal mesh with dashed lines. When the upper layer metal mesh and the lower layer metal mesh are formed the Bridge region, in which at the positions where there are metal wires in the lower layer metal mesh, there are not metal wires in the upper layer metal mesh; and at the positions where there are metal wires in the upper layer metal mesh, there are not metal wires in the lower layer metal mesh, as shown in FIG. 10-3. Researches show that because of the incompleteness of the upper layer metal mesh of the Bridge region and the reflections of both the metal wires in the upper layer metal mesh and in the lower layer metal mesh of in the Bridge region, therefore the mesh pattern of Bridge region is quite different from that of Bulk region and Boundary region, which results in mura defects in dots, lines or blocks in the Bridge region.

Figures 1, 11:
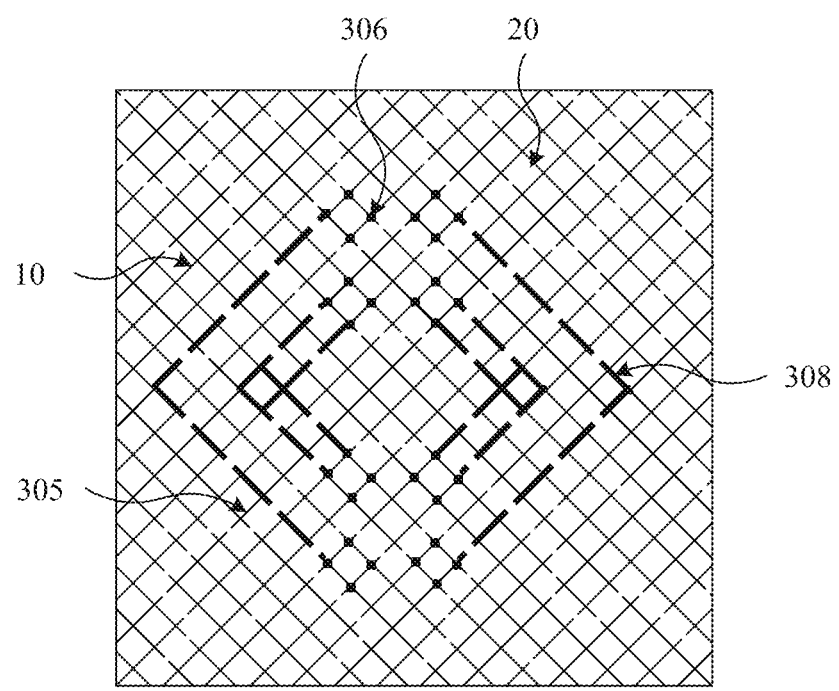
Figures 2, 11:
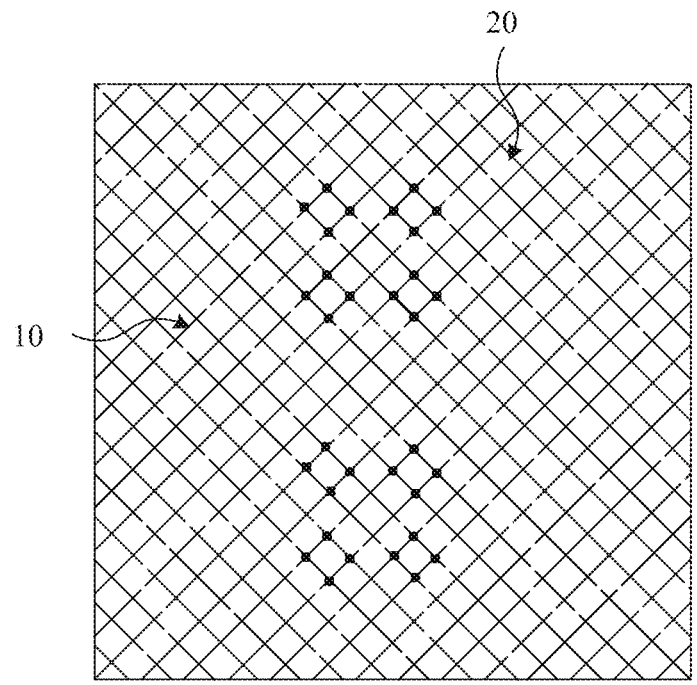

FIG. 11-1 to FIG. 11-2 are schematic structural diagrams of the metal mesh in the Bridge region according to an exemplary embodiment of the present disclosure, which are the lager image of the B region in FIG. 3. The mesh pattern unit is in shape of rhombus. The metal mesh in the Bridge region includes a lower layer metal mesh disposed on the bridge layer and an upper layer metal mesh disposed on the touch control layer, wherein the lower layer metal mesh serves as a connecting bridge and is configured to enable the second touch control electrodes 20 disposed on the touch control layer to connect to each other, and the upper layer metal mesh is configured to enable the first touch control electrodes 10 disposed on the same layer to connect to each other.

FIG. 11-1 is a structural schematic diagram of the upper layer metal mesh according to an exemplary embodiment of the present disclosure, and the upper layer metal mesh is disposed on the touch control layer. In an exemplary embodiment, the lower layer metal mesh of the present disclosure may adopt the structure as shown in FIG. 10-1. As shown in FIG. 11-1, the upper layer metal mesh includes first touch control electrodes 10, second touch control electrodes 20, a first connecting unit 305, a second connecting unit 306 and a first connecting wire 308, wherein the first touch control electrodes 10 are arranged at intervals along the horizontal direction. As a first connecting part, the first connecting unit 305 connects two adjacent first touch control electrodes 10. The second touch control electrodes 20 are arranged at intervals in the vertical direction. As a second connecting part, the second connecting unit 306 and the lower layer metal mesh together connect two adjacent second touch control electrodes 20; The structure of the first connecting unit 305 is the same as that of the first connecting unit 305 as shown in FIG. 10-1, so that two adjacent first touch control electrodes 10 and the first connecting unit 305 are formed an integrated structure with connection to each other. The second connecting unit 306 includes a plurality of second bonding pads whose positions are corresponding to the ones of the plurality of first bonding pads on the lower layer metal mesh, i.e., the positions of the second connecting units 306 are corresponding to the positions of the bonding pads parts on the lower layer metal mesh. And the second connecting unit 306 is configured to be coupled to the plurality of first bonding pads disposed on the bridge layer through the via holes opened on the insulating layer. The positions of the plurality of first connecting wires 308 are corresponding to the plurality of the second connecting wires 304 in the lower layer metal mesh and are configured to block the second connecting wires of the lower layer metal mesh. The first connecting wires 308 are provided with a plurality of cuts which disconnect the first connecting wires 308, thus ensuring that the second bonding pads on the upper layer metal mesh are insulated from both the first touch control electrodes 10 and the first connecting unit 305. In FIG. 11-1, the first connecting wire is shown in bold line, the line width of the actual first connecting wires is the same as that of the metal wires of the mesh pattern, and FIG. 11-1 illustrates the first connecting wires in bold only for describing the first connecting wires clearly.

FIG. 11-2 is a schematic structural diagram of the metal mesh in Bridge region according to an exemplary embodiment of the present disclosure. As shown in FIG. 11-2, when the upper layer metal mesh and the lower layer metal mesh are formed the Bridge region, in which at the positions where there are metal wires in the lower layer metal mesh, there are the first connecting wires arranged in the upper layer metal mesh. And the orthographic projections of the first connecting wires in the upper layer metal mesh on the substrate is basically overlapped with the orthographic projections of the second connecting wires on the lower layer metal mesh on the substrate. In the exemplary embodiment of this disclosure, "the orthographic projection of A on the substrate is basically overlapped with the orthographic projection of B on the substrate" means that the overlap range of the orthographic projection of A and the orthographic projection of B is greater than 90%. In an exemplary embodiment, a plurality of cuts are provided on the first connecting wires, and the overlap range of the orthographic projections of the first connecting wires of the upper layer metal mesh on the substrate and the orthographic projections of the second connecting wires of the lower layer metal mesh on the substrate is greater than 95%. In this way, the completeness of the upper layer metal mesh in the Bridge region is ensured and the reflection of metal wires in the lower layer metal mesh in the Bridge region is blocked by the first connecting wires disposed on the upper layer metal mesh. The reflection of metal wires in the Bridge region mainly comes from the metal wires of the upper layer metal mesh, so that the mesh pattern units in the Bridge region have little difference from the mesh pattern units in the Bulk region and the Boundary region, thereby dot-shaped, line-shaped or block-shaped mura defects in the Bridge region may be prevented.

In an exemplary embodiment, the metal mesh of the touch control structure layer is formed by splicing of a plurality of repeating units, which are the basic units constituting the metal mesh of the touch control structure layer. The metal mesh of the touch control structure layer may be formed by repetitive and continuous arrangement of the repeating units along a certain direction. Each repeating unit includes a plurality of mesh pattern units on which a plurality of cuts are provided. In some possible implementations, considering the convenience of design and flexibility of change in the design process for the designer, in the repeating units arrangement design performed with repetitive arrangement mode, the repeating units arranged repetitively may include any one or more of basic repeating units, mirror repeating units, inverted repeating units and rotary repeating units, to which and this disclosure does not provide any limit.

In an exemplary embodiment, when cuts are provided in the Bulk region, the Boundary region and the Bridge region, the cuts may include, according to the relative positions of the cuts, any one or more of isolated cuts, continuous cuts and corner cuts, or according to direction of the cuts, the cuts may include any one or more of the first direction cuts, the second direction cuts and the third direction cuts, or according to the positional relationship between the cuts and the subpixels, the cuts may include any one or more of the first cuts, the second cuts and the third cuts.

Figures 1, 12:
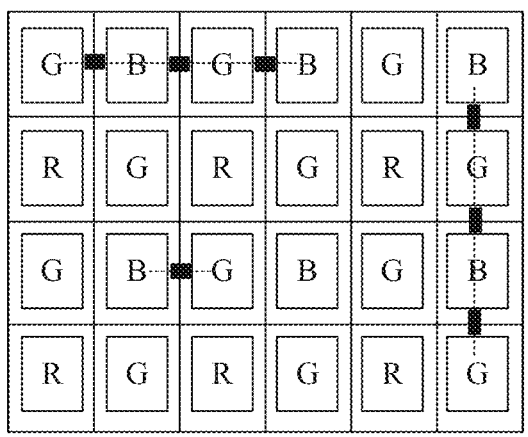
Figures 2, 12:
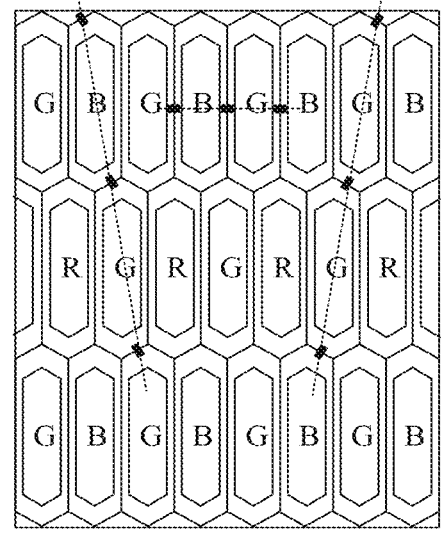

In an exemplary embodiment, when a plurality of cuts are continuously arranged in one direction, the number of cuts of the continuous cuts is less than or equal to 3 in one direction. FIG. 12-1 to FIG. 12-2 are schematic diagrams of continuous cuts in an exemplary embodiment of this disclosure, in which black blocks represent cuts and the cuts may be understood as imaginary lines for disconnecting the metal wires, and dashed lines represent the direction of imaginary lines for cutting. In the present disclosure, a polygonal mesh pattern unit includes at least two parallel first sides and two parallel second sides, and the first side and the second side are non-parallel. "Continuous cuts" refers to that cuts are provided on both first sides of each of the at least one mesh pattern unit continuously arranged along the first direction. The first direction intersects the first sides of each mesh pattern unit, or refers to that cuts are provided on both second sides of each of the at least one mesh pattern unit continuously arranged along the second direction. The second direction intersects the second sides of each mesh pattern unit. In other words, if a polygonal subpixel includes at least two parallel first side edges and both of the metal wires on the two parallel first side edges are provided with cuts, the cuts on the metal wires on the two first side edges are continuous cuts, and the subpixel has continuous cuts. The metal wires of the side edges of the subpixel refer to the metal wires located in the region where the subpixel boundary is located. Subpixels refer to the light-emitting region while the subpixel boundaries refer to the non-light-emitting region enclosing the subpixels. "Isolated cut" means that if only one side of a polygonal mesh pattern is provided with a cut, the mesh patter unit has an isolated cut. Or, if only one metal wire on one side edge of a subpixel is provided with a cut, the subpixel has an isolated cut. In the present disclosure, "parallel" refers to a state in which two straight lines form an angle larger than −10° but smaller than 10° while "perpendicular" may refer to a state in which the angle is larger than 80° but smaller than 100°.

As shown in FIG. 12-1, continuous cuts and an isolated cut are illustrated with a mesh pattern. With respect to the mesh pattern unit of the first mesh row and second mesh column, if one cut is disposed on the first side (metal wire) on the left of mesh pattern unit, another cut is disposed on the first side (metal wire) on the right of the mesh pattern unit, and the left first side and the right first side are parallel and thus, then the two cuts are continuous cuts and the number of the cuts in the continuous cuts is 2. If another adjacent mesh pattern unit in the row direction is provided with continuous cuts, then the number of cuts of the continuous cuts in the row direction is 3. With respect to the mesh pattern unit of the third mesh row and the second mesh column and the mesh pattern unit of the third mesh row and the mesh third column, if only one side of the mesh pattern unit is provided with a cut, then the cut is an isolated cut.

As shown in FIG. 12-1, subpixels may be used to illustrate consecutive cuts and isolated cuts. For the B subpixel corresponding to the first mesh row and the second mesh column, if a cut is provided on the metal wire within the subpixel boundary region on the left side of the B subpixel, and another cut is provided on the metal wire within the subpixel boundary region on the right side of the B subpixel, and the left side and the right side are parallel, then the two cuts are continuous cuts, and the number of cuts of the continuous cuts is 2. If the metal wires of the left side and right side of the G subpixel adjacent to the B subpixel in the left direction are provided with cuts, then the number of consecutive cuts in this direction is 3. With respect to the G subpixel corresponding to the second mesh row and the sixth mesh column, if a cut is provided on the metal wire within the subpixel boundary region on its upper side of the G subpixel, another cut is provided on the metal wire within the subpixel boundary region on its lower side of the G subpixel, and the upper side and the lower side are parallel, then the two cuts are consecutive cuts, and the number of cuts of the consecutive cuts is 2. If the metal wires of the lower side and upper side of the B subpixel adjacent to the G subpixel in the downward direction are provided with cuts, then the number of the consecutive cuts in this direction is 3. With respect to B subpixel corresponding to the third mesh row and the second mesh column and G subpixel corresponding to the third mesh row and the third mesh column, if only the metal wire in the subpixel boundary region on the right side of B subpixel is provided with a cut, and only the metal wire in the subpixel boundary region on the left side of G subpixel is provided with a cut, then the cut between the B subpixel and the G subpixel is an isolated cut.

As shown in FIG. 12-2, One set of consecutive cuts is horizontal and the number of cuts in the consecutive cuts is 3; the other two sets of consecutive cuts are diagonal and the number of cuts in each set of the consecutive cut is 3. The diagonal direction include upper left direction and upper right direction, or lower right direction and lower left direction.

In an exemplary embodiment, for corner cuts, when there are consecutive cuts in the corner cuts in the first direction or the second direction, the number of cuts in the consecutive cuts is less than or equal to 2. FIG. 13-1 to FIG. 13-2 are schematic diagrams of corner cuts according to an exemplary embodiment of the present disclosure. In this disclosure, "corner cut" refers to that if two cuts are respectively provided on a first side and a second side of a polygonal mesh pattern unit, then the two cuts are a set of corner cuts, and if the mesh pattern unit has corner cuts, that means turning occurred in the directions of the cuts on both sides of the mesh pattern units. Alternatively, a polygonal subpixel at least includes a first side and a second side which are not parallel. If the metal wires on the two non-parallel first and second sides are both provided with cuts, then the two cuts are a set of corner cuts, i.e. turning occurred in the directions of the cuts on both sides of the subpixel.

As shown in FIG. 13-1, corner cuts are illustrated with a mesh pattern. With respect to the mesh pattern unit corresponding to the first mesh row and the third mesh column, if a cut is provided on the first side on the left of the mesh pattern unit, and another cut is provided on the second side on the lower-side of the mesh pattern unit, since the first side is not parallel with the second side, then the two cuts are a set of corner cuts, and the directions of the corner cuts are left and the down respectively. The mesh pattern unit correspond to the first mesh row and the second mesh column is adjacent to the first side, and this mesh pattern unit has consecutive cuts and thus, the corner cuts include consecutive cuts on the left and the number of cuts in the consecutive cuts is 2. The mesh pattern unit of the second mesh row and the third mesh column is adjacent to the second side, and the mesh pattern unit has consecutive cuts and thus, the lower-side of the corner cuts include consecutive cuts and the number of cuts in the consecutive cuts is 2.

As shown in FIG. 13-1, corner cuts are illustrated with reference to subpixels. With respect to the G subpixel corresponding to the first mesh row and the third mesh column, a leftward-extending cut is provided on the metal wire within the subpixel boundary region on the left side of the G subpixel and another downward-extending cut on the metal wire in the subpixel boundary region on the lower-side of the subpixel and thus, leftward-extending cut and the downward-extending cut constitute a set of corner cuts, and the directions of the corner cuts are of left and down. When the B subpixel whose left-side is adjacent to the G subpixel has consecutive cuts, the corner cuts include consecutive cuts on the left, and the number of cuts in the consecutive cuts is 2. When the R subpixel whose lower-side is adjacent to the G subpixel has consecutive cuts, then the lower-side of the corner cuts includes consecutive cuts, and the number of cuts in the consecutive cuts is 2.

As shown in FIG. 13-2, a set of corner cuts have the directions of left and lower right respectively includes consecutive cuts in both the two directions and the numbers of cuts in the respective consecutive cuts are 2. Another set of corner cuts have the direction of right and lower left, and have consecutive cuts on the lower left, and the number of cuts in the consecutive cuts is 2.

In an exemplary embodiment, when a plurality of sets of corner cuts are consecutively arranged, the sets of corner cuts form an open shape. FIG. 14-1 to FIG. 14-2 are schematic diagrams of open shapes according to an exemplary embodiment of the present disclosure. As shown in FIG. 14-1, the G subpixel of the first mesh row and the third mesh column is provided with a set of corner cuts, and one end of the corner cuts is the G subpixel of the first mesh row and the first mesh column. The G subpixel of the third mesh row and the third mesh column is provided with another set of corner cuts, and one end of the corner cuts is the G subpixel of the third mesh row and the first mesh column. Since the ends of the two set of corner cuts do not overlapped, the shape formed by the two sets of corner cuts are open shape, and all the cuts in the two set of corner cuts do not form a closed loop. As shown in FIG. 14-2, the G subpixel of the first mesh row and the third mesh column is provided with a set of corner cuts, and one end of the corner cuts is the G subpixel of the first mesh row and the first mesh column. The B subpixel of the third mesh row and the fourth mesh column is provided with another set of corner cuts, and one end of the corner cuts is the B subpixel of the third mesh row and the sixth mesh column. Since the ends of the two sets of corner cuts do not overlapped, the shape formed by the two sets of corner cuts are open shape.

According to the exemplary embodiment of the present disclosure, by setting the relative position relationship between cuts, the cuts may be uniformly arranged on the metal mesh to the maximum extent, which may prevent the brightness difference caused by interference among multiple cuts in one direction or one region, reduce the visibility of cuts, and mitigate the mura defect of the Bridge region.

In an exemplary embodiment, when cuts are provided in the Bulk region, the Boundary region and the Bridge region, the cuts may include, according to the directions of the cuts, at least a first direction cut and a second direction cut. Because the mesh pattern unit is a polygon formed with metal wires, thus a mesh pattern unit includes at least a first side and a second side which are not parallel. A cut disconnecting the first side is a first direction cut and a cut disconnecting the second side is a second direction cut. FIG. 15-1 to FIG. 15-2 are schematic diagrams of directions of cuts according to an exemplary embodiment of the present disclosure. As shown in FIG. 15-1, in a rectangular mesh pattern unit, the cuts disconnecting the vertical metal wires (first sides) are first direction cuts (horizontal cuts), and the cut disconnecting the horizontal metal wires (second sides) are second direction cuts (vertical cuts). As shown in FIG. 13-2, in a hexagonal mesh pattern unit, the cut disconnecting the upper right metal wire (a first side) is a first direction cut (an upper left cut), and the cut disconnecting the upper left metal wire (a second side) is a second direction cut (an upper right cut). In an exemplary embodiment, a first direction cut may be any one of a horizontal cut, a vertical cut and a diagonal cut while a second direction cut may be any one different from the first direction cut; a diagonal cut may be any one or more of an upper left cut and an upper right cut. In the following embodiment, it is illustrated by taking that a first direction cut is a horizontal cut, a second direction cut is a vertical cut, and a third direction cut is an diagonal cut as an example.

Figure 16:
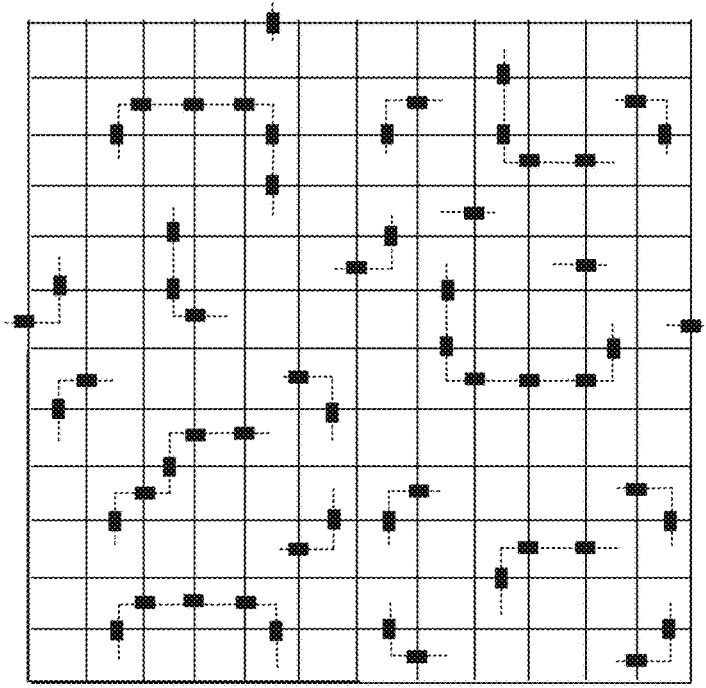
FIG. 16 is a schematic diagram of cut density according to an exemplary embodiment of the present disclosure.

In an exemplary embodiment, cut density refers to the ratio of the number of cuts in one repeating units to the number of mesh pattern units in one repeating unit. FIG. 16 is a schematic diagram of cut density according to an exemplary embodiment of the present disclosure. As shown in FIG. 16, in a repeating unit there are for example 12*12 rectangular mesh pattern units, and the number of mesh pattern units is 144 while the number of cuts arranged in the repeating unit is 58, and thus the cut density is 58/144=0.403. Within the 58 cuts, the number of horizontal cuts is 31 while the number of vertical cuts is 27 and thus, the density of horizontal cuts is 31/144=0.215 and that of vertical cuts is 27/144=0.188. In an exemplary embodiment, the cut density in one repeating units may be 10% to 90%.

Figure 17:
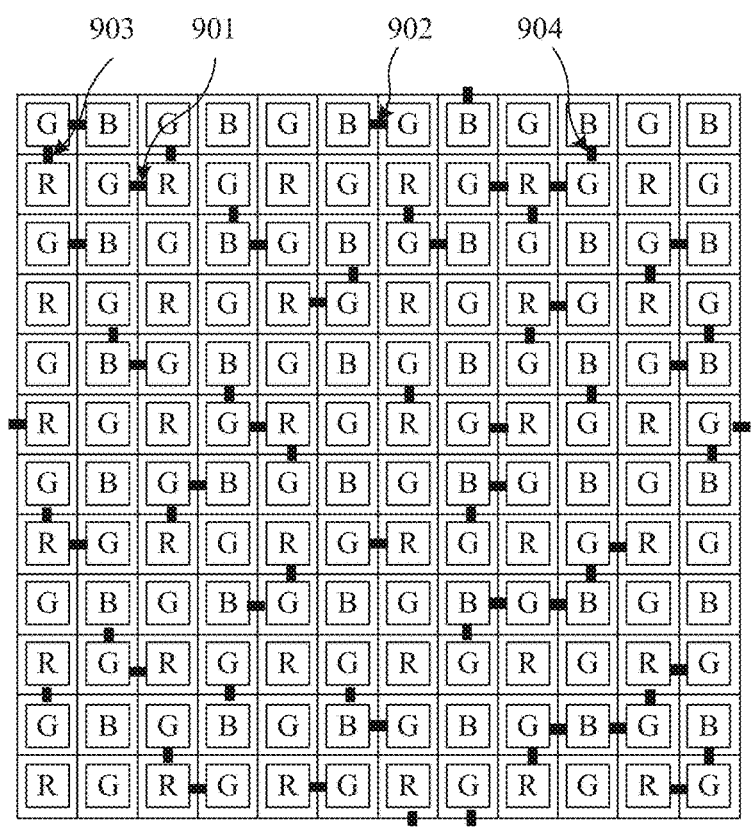
FIG. 17 is a schematic diagram of a cut arrangement according to an exemplary embodiment of the present disclosure.

FIG. 17 is a schematic diagram of one type of cuts arrangement according to an exemplary embodiment of the present disclosure, illustrating the cuts arrangement in a repeating unit including 12*12 rectangular mesh pattern units. The 12*12 mesh pattern units in the repeating unit have the same shape and corresponding positions as the 12*12 subpixels on the display structure layer, wherein the 12*12 subpixels are periodically arranged in form of GBRG square. As shown in FIG. 17, the cuts in the repeating units include a first horizontal cut 901 disposed between an R subpixel and a G subpixel arranged horizontally, a second horizontal cut 902 disposed between a B subpixel and G subpixel arranged horizontally, a first vertical cut 903 disposed between R subpixel and G subpixel arranged vertically, a second vertical cut 904 disposed between B subpixel and G subpixel arranged vertically.

In an exemplary embodiment, the ratio of the first horizontal cut density to the second horizontal cut density may be 0.7-1.3 within a repeating unit; the ration of the first vertical cut density to the second vertical cut density may be 0.7-1.3 within a repeating unit. In some possible implementations, the first horizontal cut density may be equal to the second horizontal cut density; the first vertical cut density may be equal to the second vertical cut density. The first horizontal cut density is the ratio of the number of first horizontal cuts 901 and the number of mesh pattern units in the repeating unit, and the second horizontal cut density is the ratio of the number of second horizontal cuts 902 to the number of mesh pattern units in the repeating unit. The first vertical cut density is the ratio of the number of first vertical cuts 903 and the number of mesh pattern units in the repeating unit, and the second vertical cut density is the ratio of the number of second vertical cuts 904 to the number of mesh pattern units in the repeating unit.

For example, within the region of 12*12 mesh pattern units as shown in FIG. 17, the numbers of second horizontal cuts 902 are 2, 4, 2, 2, 3, and 3 in the first, third, fifth, seventh, ninth and eleventh mesh rows respectively, and the number of second horizontal cuts 902 in the repeating unit is 16; the numbers of first horizontal cuts 901 are 3, 1, 2, 4, 2 and 3 in the second, fourth, sixth, eighth, tenth and twelfth mesh rows respectively, and the number of first horizontal cuts 901 in the repeating unit is 17; and thus the ratio of the first horizontal cut density to the second horizontal cut density is 1.06. For another example, in a repeating unit of 12*12 mesh pattern units illustrated in FIG. 17, the numbers of first vertical cuts 903 are 3, 2, 2, 2, 3 and 2 in the first, third, fifth, seventh, ninth and eleventh columns respectively, and the number of first vertical cuts 903 in the repeating unit is 14; the numbers of second vertical cuts 904 are 2, 3, 2, 3, 3 and 3 in the second, fourth, sixth, eighth, tenth and twelfth column respectively, and the number of second vertical cuts 904 in the repeating unit is 16; and thus, the ratio of the first vertical cut density to the second vertical cut density is 1.14.

Since the first horizontal cuts are arranged between R subpixels and G subpixels, it may be understood as that one first horizontal cut corresponds to one R subpixel and one G subpixel and thus, when the number of first horizontal cuts is 16, 16 first horizontal cuts correspond to R subpixels and G subpixels. Since the second horizontal cuts are arranged between B subpixels and G subpixels, it may be understood as that one second horizontal cut corresponds to one B subpixel and one G subpixel and thus, when the number of second horizontal cuts is 17, 17 second horizontal cuts correspond to B subpixels and G subpixels. In this way, regarding all the horizontal cuts, a number of those cuts corresponding to R subpixels is 16 and a number of those cuts corresponding to B subpixels is 17; and a number of those cuts corresponding to G subpixels is 33. Thus the numbers corresponding to R subpixels and B subpixels are close, and the number corresponding to G subpixel is equal to the sum of the numbers corresponding to R subpixels B subpixels.

Since the first horizontal cuts are arranged between R subpixels and G subpixels, it can be understood that one R subpixel has one adjacent first horizontal cut and one G subpixel has one adjacent first horizontal cut. Therefore, when the number of first horizontal cuts is 16, 16 R subpixels have adjacent first horizontal cuts and 16 G subpixels have adjacent first horizontal cuts. Since the second horizontal cuts are arranged between B subpixels and G subpixels, it can be understood that one B subpixel has one adjacent second horizontal cut and one G subpixel has one adjacent second horizontal cut. Therefore, when the number of second horizontal cuts is 17, 17 B subpixels have adjacent second horizontal cuts and 17 G subpixels have adjacent second horizontal cuts. In this way, of all the subpixels, there are 16 R subpixels adjacent to horizontal cuts, 17 B subpixels adjacent to horizontal cuts and 33 G subpixels adjacent to horizontal cuts; the numbers of R subpixels adjacent to horizontal cuts and B subpixels adjacent to horizontal cuts are close; the number of G subpixels adjacent to horizontal cuts are the sum of the numbers R subpixels adjacent to horizontal cuts and B subpixels adjacent to horizontal cuts.

The cuts in a repeating unit may be divided into first cuts and second cuts. First cuts are cuts provided between an R subpixel and a G subpixel, i.e., include first horizontal cuts and first vertical cuts. Second cuts are cuts provided between a B subpixel and a G subpixel, i.e., include second horizontal cuts and second vertical cuts. In an exemplary embodiment, the ratio of the first cut density to the second cut density may be 0.7-1.3 within a repeating unit.

In an exemplary embodiment, when subpixels are periodically arranged in other ways, the cuts in the repeating unit may be divided into first cuts, second cuts and third cuts, wherein the first cuts are arranged between R subpixels and G subpixels, the second cuts are arranged between B subpixels and G subpixels, and the third cuts are arranged between R subpixels and B subpixels. In a repeating unit, the ratio of the first cut density to the second cut density may be 0.7-1.3; the ratio of the second cut density to the third cut density may 0.7-1.3; the ratio of the first cut density to the third cut density may be 0.7-1.3. In some possible implementations, the first, second and third cuts may all include any one or more of horizontal (first direction) cuts, vertical (second direction) cuts and diagonal (third direction) cuts and the diagonal cuts may include any one or more of upper left cuts and upper right cuts, to which the present disclosure does not provide any limit.

In some possible implementations, the ratio of the first cut density to the second cut density may be 0.7-1.3, which includes any one or more of the following: the ratio of the first horizontal cut density to the second horizontal cut density may be 0.7-1.3; the ratio of the first vertical cut density to the second vertical cut density may be 0.7-1.3; and the ratio of the first diagonal cut density to the second diagonal cut density may be 0.7-1.3.

In some possible implementations, the ratio of the second cut density to the third cut density may be 0.7-1.3, which includes any one or more of the following: the ratio of the second horizontal cut density to the third horizontal cut density may be 0.7-1.3; the ratio of the second vertical cut density to the third vertical cut density may be 0.7-1.3; and the ratio of the second diagonal cut density to the third diagonal cut density may be 0.7-1.3.

In some possible implementations, the ratio of the first cut density to the third cut density may be 0.7-1.3, which includes any one or more of the following: the ratio of the first horizontal cut density to the third horizontal cut density may be 0.7-1.3; the ratio of the first vertical cut density to the third vertical cut density may be 0.7-1.3; and the ratio of the first diagonal cut density to the third diagonal cut density may be 0.7-1.3.

According to the exemplary embodiment of the present disclosure, the first cut density, the second cut density and the third cut density in the repeating unit are set to be equal to or close to each other, such that the numbers of different color subpixels corresponding to the cuts are basically the same, the numbers of different color subpixels adjacent to cuts are basically the same, and the cuts are evenly distributed among the different color subpixels, which may reduce the visibility of the cuts and mitigate the mura defect in the Boundary region.

In an exemplary embodiment, the Bulk region, Boundary region and Bridge region are all provided with a plurality of cuts. The cuts in the Bulk region form dummy regions and electrode regions respectively. The cuts in the Boundary region achieve the isolation of the first touch control electrodes and the second touch control electrodes. The cuts in the Bridge region form connecting structures. Because there are contiguous zones among the Bulk region, Boundary region and Bridge region, the mura defect of Bridge region may be mitigated by proper setting of cut density of the contiguous zones.

As shown in FIG. 3, the repeating units constituting the metal mesh of the touch control structure layer may be divided into the first repeating units C1 including the cuts in the Bridge region; the second repeating units C2 including the cut in the Bulk region; and the third repeating units C3 including the cuts in the Boundary region. In an exemplary embodiment, the first repeating units C1, the second repeating units C2 and the third repeating units C3 are the same in area. In an exemplary embodiment, the ratio of the cut density of the first repeating units to the cut density of the second repeating units may be 0.7-1.3; the ratio of the cut density of the first repeating units to the cut density of the third repeating units may be 0.7-1.3; the ratio of the cut density of the second repeating units to the cut density of the third repeating units may be 0.7-1.3.

In an exemplary embodiment, the cuts in the first, the second, and the third repeating units may include any one or more of the first direction cuts, the second direction cuts and the third direction cuts.

In some possible implementations, the ratio of the cut density of the first repeating units to the cut density of the second repeating units may be 0.7-1.3, which includes any one or more of the following: the ratio of the first direction cut density of the first repeating units to the first direction cut density of the second repeating units may be 0.7-1.3; the ratio of the second direction cut density of the first repeating units to the second direction cut density of the second repeating units may be 0.7-1.3; and the ratio of the third direction cut density of the first repeating units to the third direction cut density of the second repeating units may be 0.7-1.3.

In some possible implementations, the ratio of the cut density of the first repeating unit to the cut density of the third repeating unit may be 0.7-1.3, which includes any one or more of the following: the ratio of the first direction cut density of the first repeating units to the first direction cut density of the third repeating units may be 0.7-1.3; the ratio of the second direction cut density of the first repeating units to the second direction cut density of the third repeating units may be 0.7-1.3; and the ratio of the third direction cut density of the first repeating units to the third direction cut density of the third repeating units may be 0.7-1.3.

In some possible implementations, the ratio of the cut density of the second repeating unit to the cut density of the third repeating unit may be 0.7-1.3, which includes any one or more of the following: the ratio of the first direction cut density of the second repeating units to the first direction cut density of the third repeating units may be 0.7-1.3; the ratio of the second direction cut density of the second repeating units to the second direction cut density of the third repeating units may be 0.7-1.3; and the ratio of the third direction cut density of the second repeating units to the third direction cut density of the third repeating units may be 0.7-1.3.

In an exemplary embodiment, a first region may be defined in the region where the Bridge region is located, and the area of the first region is equal to the area of a first repeating unit. A plurality of second regions may be defined in the region where the Bulk region is located, and the area of each second region is equal to the area of a second repeating unit. A plurality of third regions may be defined in the region where the Bridge region is located, and the area of each third region is equal to the area of a third repeating unit. In the exemplary embodiment, ratio of the cut density of the first repeating units to the cut density of the second repeating units may be 0.7-1.3, which can be extended to that, the cut ratio of cut density of a first region to the cut density of any one of the second region may be 0.7-1.3. Ratio of the cut density of the first repeating units to the cut density of the third repeating units may be 0.7-1.3, which can be extended to that, the cut ratio of cut density of a first region to the cut density of any one of the third region may be 0.7-1.3. Ratio of the cut density of the second repeating units to the cut density of the third repeating units may be 0.7-1.3, which can be extended to that the cut ratio of cut density of a second region to the cut density of any one of the third region may be 0.7-1.3.

Figure 18:
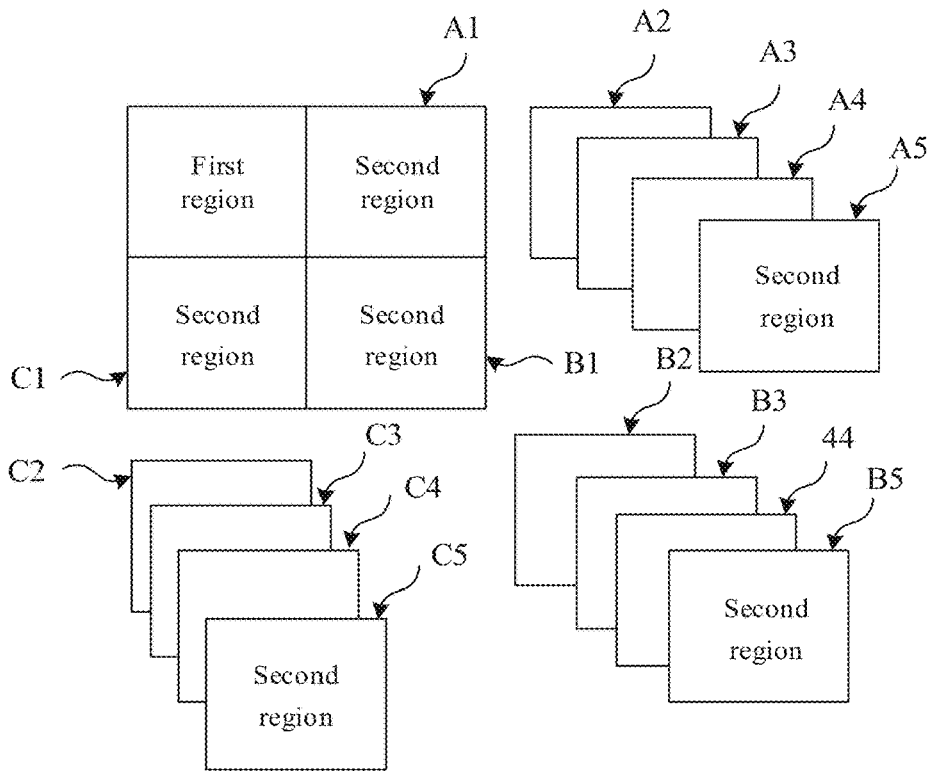
FIG. 18 is a schematic diagram of region arrangement according to an exemplary embodiment of the present disclosure.

FIG. 18 is a schematic diagram of region arrangement according to an exemplary embodiment of the present disclosure. As shown in FIG. 18, compared with the first region defined as the region where the Bridge region is located, multiple second regions may be defined in the region where the Bulk region is located, such as second regions A1-A5 located in the direction of right of the first region, second regions B1-B5 located in the direction of lower right of the first region, and second regions C1-C5 located in the direction below the first region. Taking the second region in the direction of right as an example, the second regions A1-A5 may be defined as separate regions or may be defined as overlapping regions. The ratio of cut density of the first region to the cut density of any second region refers to the ratio of cut density of the first region to the cut density of the second region A1, or, the ratio of cut density of the first region to the cut density of the second region A2, or the ratio of cut density of the first region to the cut density of the second region A3, the ratio of cut density of the first region to the cut density of the second region A4, or the ratio of cut density of the first region to the cut density of the second region A5.

According to the exemplary embodiment of the present disclosure, with the setting of the relationship of cut densities among Bridge region, Bulk region and Boundary region, the cuts difference among Bridge region, Bulk region and Boundary region is reduced and thereby the brightness difference among Bridge region, Bulk region and Boundary region is reduced, the visibility of cut may be reduced, and the mura defect of Bridge region can be mitigated.

In an exemplary embodiment, the plurality of cuts in the first, second and third repeating units each may include first cuts, second cuts and third cuts according to the positional relation between cuts and subpixels, wherein the first cuts are arranged between R subpixels and G subpixels, the second cuts are arranged between B subpixels and G subpixels, and the third cuts are arranged between R subpixels and B subpixels.

In some possible implementations, the ratio of the cut density of the first repeating unit to the cut density of the second repeating unit may be 0.7-1.3, which includes any one or more of the following: the ratio of the first cut density of the first repeating units to the first cut density of the second repeating units may be 0.7-1.3; the ratio of the second cut density of the first repeating units to the second cut density of the second repeating units may be 0.7-1.3; and the ratio of the third cut density of the first repeating units to the third cut density of the second repeating units may be 0.7-1.3.

In some possible implementations, the ratio of the cut density of the first repeating unit to the cut density of the third repeating unit may be 0.7-1.3, which includes any one or more of the following: the ratio of the first cut density of the first repeating units to the first cut density of the third repeating units may be 0.7-1.3; the ratio of the second cut density of the first repeating units to the second cut density of the third repeating units may be 0.7-1.3; and the ratio of the third cut density of the first repeating units to the third cut density of the third repeating units may be 0.7-1.3.

In some possible implementations, the ratio of the cut density of the second repeating unit to the cut density of the third repeating unit may be 0.7-1.3, which includes any one or more of the following: the ratio of the first cut density of the second repeating units to the first cut density of the third repeating units may be 0.7-1.3; the ratio of the second cut density of the second repeating units to the second cut density of the third repeating units may be 0.7-1.3; and the ratio of the third cut density of the second repeating units to the third cut density of the third repeating units may be 0.7-1.3.

According to the exemplary embodiment of the present disclosure, the quantities of the subpixels of different colors respectively corresponding to the cuts arranged in the Bridge region, the Bulk region and the Boundary region are basically equal. And thus, the cuts are evenly distributed among the different color subpixels, which may reduce the visibility of the cuts and mitigate the mura defect in the Bridge region.

In the exemplary embodiment, the above cut arrangement is applied to the upper metal mesh of the touch control structure layer.

Figure 19:
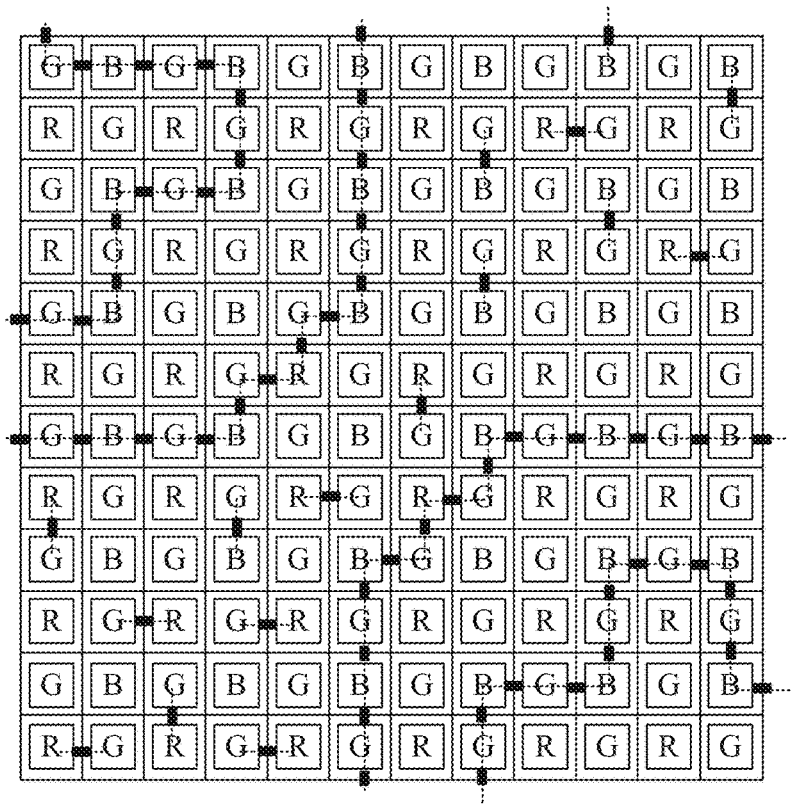
FIG. 19 to FIG. 21 are schematic diagrams of the cut arrangement of the Bridge region of the embodiments of the present disclosure.
Figure 20:
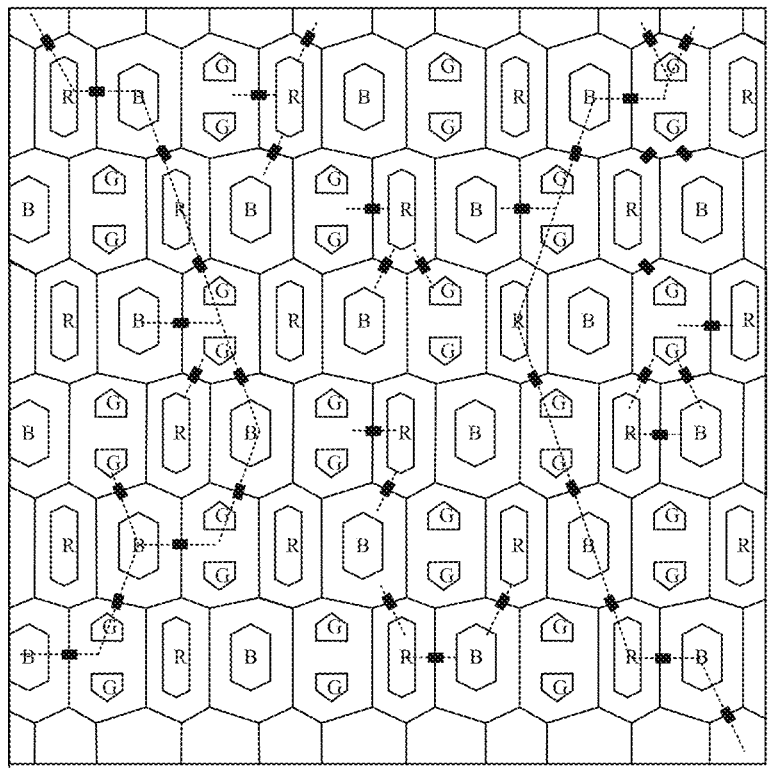
Figure 21:
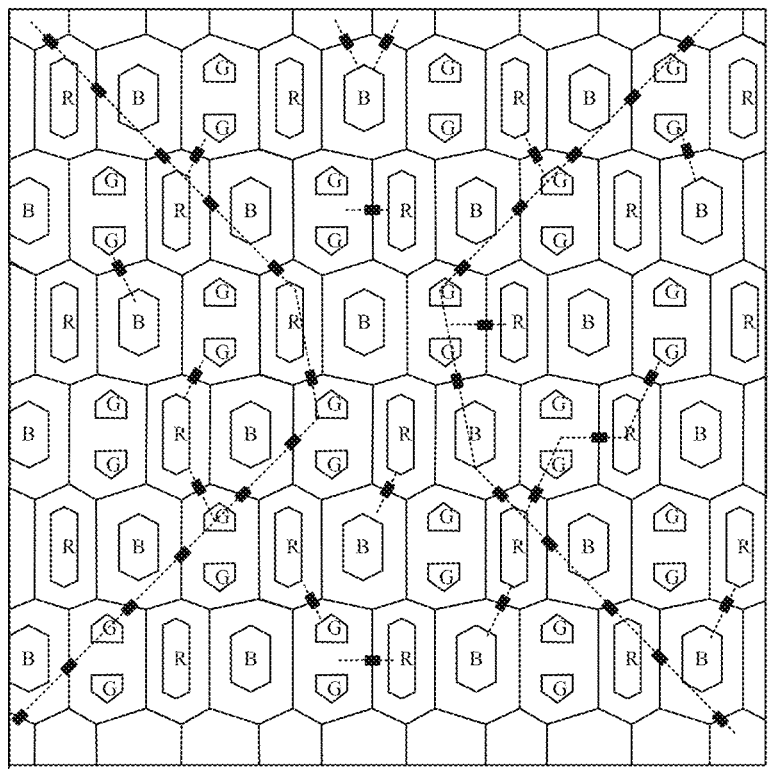
Figure 22:
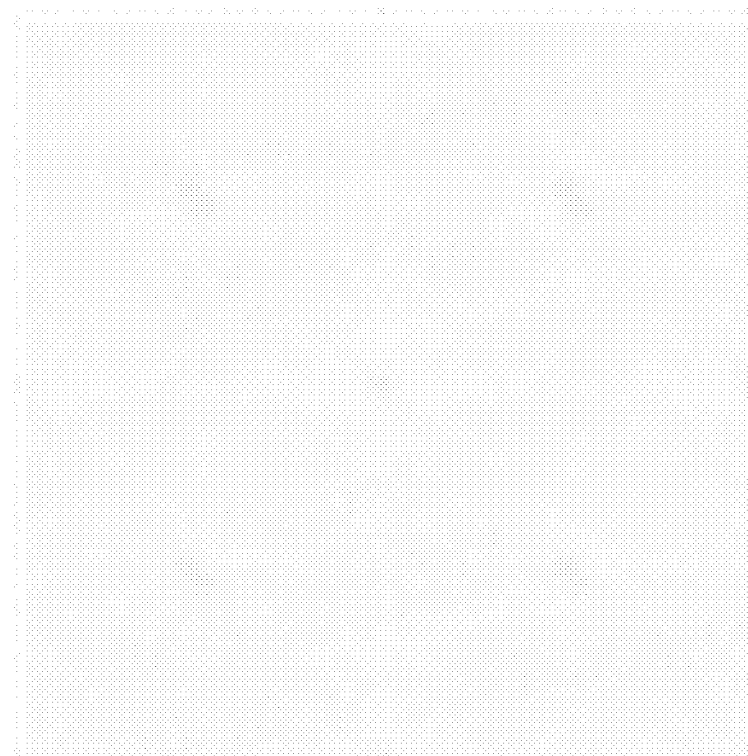
FIG. 22 is a simulated mura of the Bridge region according to an embodiment of the present disclosure.

FIG. 19 to FIG. 21 are schematic diagrams of the cut arrangement of the Bridge region of the embodiments of the present disclosure; FIG. 22 is a simulated mura of the Bridge region of the embodiments of the present disclosure; As shown by FIG. 19 to FIG. 21, the above cut arrangement in the Bridge regions in the present disclosure meets the required cut density relationships among the Bridge region, the Bulk region and the Boundary region and eliminates the differences in mesh patterns among the Bridge region, the Bulk region and the Boundary; the arrangement also meets the requirement that the ratio of the first cut density to the second cut density, the ratio of the first cut density to the third cut density and the ratio of the second cut density to the third cut density are all 0.7-1.3, and meets the requirement that the number of cuts in a set of consecutive cuts is less than or equal to three, and meets the requirement that the number of cuts in a set of consecutive cuts is less than or equal to two when the consecutive cuts are on one direction of a set of corner cuts. The plurality of corner cuts form an open shape, such that the cuts are distributed uniformly to a maximum extent in the Bridge region, the Bulk region and the Boundary region, which reduces the visibility of the cuts and improves the mura defects of the Bridge region obviously and the mura is almost invisible to naked eyes, as shown in FIG. 22.

Figure 23:
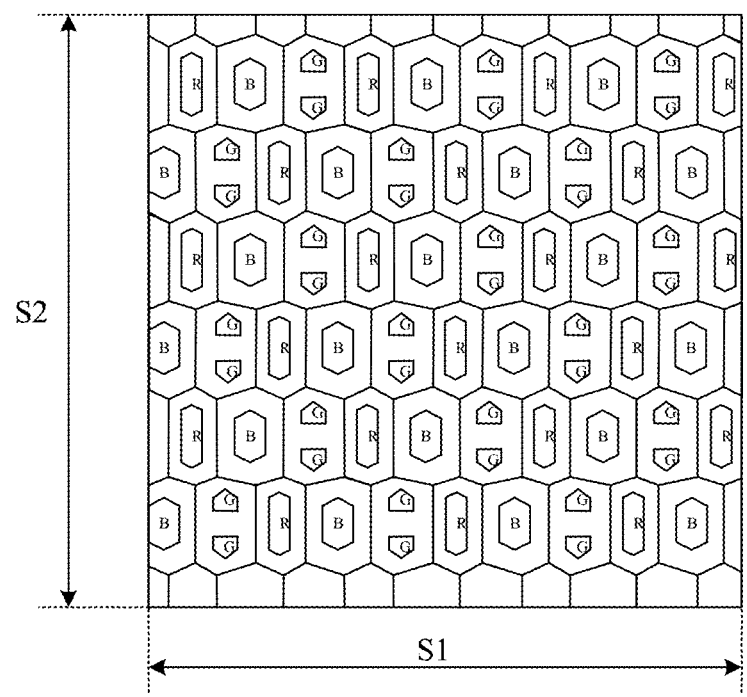
FIG. 23 is a schematic diagram of a repeating unit according to an exemplary embodiment of the present disclosure.

FIG. 23 is a schematic diagram of a repeating unit according to an exemplary embodiment of the present disclosure. The repeating unit includes 9*6 hexagonal mesh pattern units. In an exemplary embodiment, the repeating unit is the repeating unit of the Bulk region, i.e., the second repeating unit. As shown in FIG. 23, the repeating unit has a first characteristic length Si in the horizontal direction and a second characteristic length S2 in the vertical direction. In an exemplary embodiment, the first characteristic length Si is greater than or equal to the second characteristic length S2, the first characteristic length Si is referred to as the maximum characteristic length S of the repeating unit, i.e., the maximum characteristic length S is the maximum value of the first characteristic length Si and the second characteristic length S2. In an exemplary embodiment, the maximum characteristic length S of the repeating units is 0.2 mm-1.2 mm, so that the spatial frequency of the viewer's eyes within 1 degree range is greater than or equal to 10.

Figure 24:
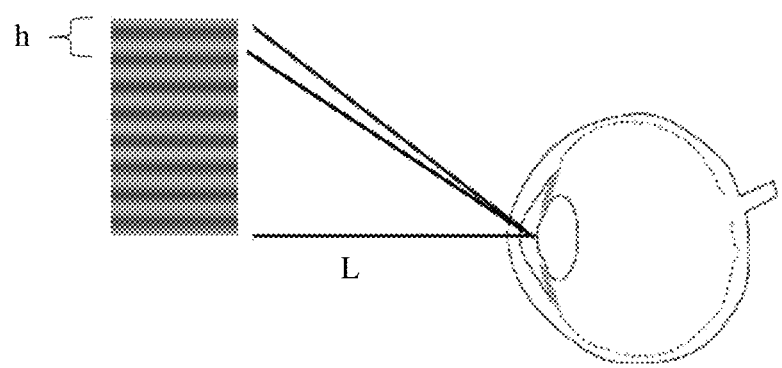
FIG. 24 is a schematic diagram of the spatial frequency of the viewer's eyes in a range of 1 degree.

FIG. 24 is a schematic diagram of the spatial frequency of the viewer's eyes in a range of 1 degree. Generally, a reciprocal of a distinguishable visual angle (degree) is used as a unit of the spatial resolution ability of eyes (i.e., visual acuity). The minimum discernible visual threshold of normal eyes is about 0.5, and the maximum visual range is 200 degrees (width)×135 degrees (height). The spatial frequency of the viewer's eyes within 1 degree range is expressed as Cycle per Degree (CPD for short), referring to the number of cycles of black and white stripes scanned in each roll of the eyeball with 1 degree. As shown in FIG. 24, the spatial frequency of the viewer's eyes within 1 degree range (CPD) is related to the distance (L) from the viewer's eyes to the display screen and the cycle of the stripes (h), and the calculation formula is:

$$CPD=1/(57.3*\arctan(h/L))$$

For a given stripe cycle (h), the greater the distance (L) is, the greater the CPD is. For a given distance L, the smaller the h is, the larger the CPD is. The research shows that with respect to the touch control structure layer formed by repeated splicing with multiple repeating units, the multiple repeating units will form light and shade stripes, and the cycle of the light and shade stripes (h) is the maximum characteristic length S of the repeating units, so the spatial frequency of the viewer's eyes within 1 degree range (CPD) meets that CPD=1/(57.3*arctan (s/l)), and furthermore:

$$S=L*\tan(1/(57.3*CPD))$$

In an exemplary embodiment, the distance (L) from the viewer's eye to the display screen is 100 mm to 1000 mm, CPD≥10, the maximum characteristic length of the repeating units is the maximum size of the repeating units in a certain direction, and 1/(57.3*CPD) is a radian value.

When a viewer watches a touch control structure layer, the distance L from the viewer's eyes to the display screen may be divided into two types: short viewing distance for a small scale screen and long viewing distance for a large scale screen. In an exemplary embodiment, regarding a short viewing distance, the distance L from the viewer's eyes to the display screen may be 100 mm to 400 mm, and regarding a long viewing distance, the distance L from the viewer's eyes to the display screen may be 400 mm to 1000 mm.

In an exemplary embodiment, for a short viewing distance, the maximum characteristic length S of the repeating units is arranged to be 0.2 mm to 0.4 mm, so that the spatial frequency of the viewer's eyes within 1 degree range (CPD) is greater than or equal to 10. In some possible implementations, the maximum characteristic length S of the repeating units is arranged to be 0.25 mm to 0.35 mm.

In an exemplary embodiment, for a long viewing distance, the maximum characteristic length S of the repeating units is arranged to be 0.4 mm to 1.2 mm, so that the spatial frequency of the viewer's eyes within 1 degree range (CPD) is greater than or equal to 10. In some possible implementations, the maximum characteristic length S of the repeating units is arranged to be 0.5 mm to 1.0 mm.

In some possible implementations, the maximum characteristic length S of the repeating units may be arranged to enable the spatial frequency of the viewer's eyes within 1 degree range (CPD) to be greater than or equal to 30.

The metal mesh of the Bulk region is formed by repeated splicing of a plurality of repeating units, the plurality of repeating units will form light and shade stripes. In the exemplary embodiment of this disclosure, through arranging the maximum characteristic length of the repeating units, the spatial frequency of the viewer's eyes within 1 degree range is increased, the sensitivity of the viewer to distinguish the light and shade stripes is reduced, thus preventing the mura under different azimuth and reducing the visibility of the mura.

Figures 1, 25:
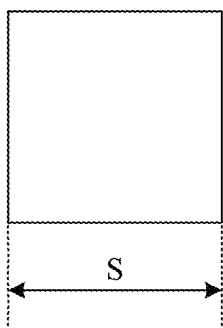
Figures 2, 25:
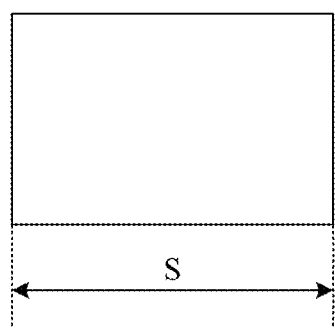
Figures 3, 25:
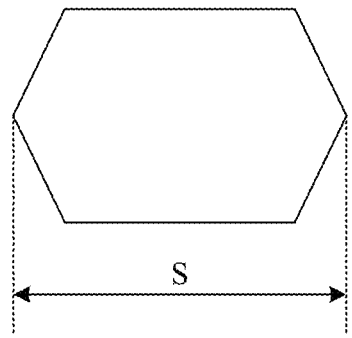

FIG. 25-1 to FIG. 25-3 are schematic diagrams of a plurality of types of repeating units. A repeating unit includes a plurality of mesh pattern units which are polygons composed of metal wires. In an exemplary embodiment, the repeating units may be square and are continuously arranged along the horizontal direction, and the side length of the square is the maximum characteristic length S, as shown in FIG. 25-1. Alternatively, the repeating units may be rectangular and are arranged continuously along the horizontal direction, and the length of the long side of the rectangle is the maximum characteristic length S, as shown in FIG. 25-2. Or, the repeating units may be hexagonal and are arranged continuously along the horizontal direction, and the maximum distance between the two vertex angles of the hexagon in the horizontal direction is the maximum characteristic length S, as shown in FIG. 25-3. In some possible implementations, the shape of the repeating units may include any one or more of triangle, square, rectangle, rhombus, trapezoid, pentagon and hexagon, to which this disclosure does not provide any limit.

The present disclosure further provides a touch control structure including a plurality of mesh pattern units which are polygons formed by metal wires; the touch control structure includes a bridge layer, an insulating layer and a touch control layer which are in stacked arrangement. The touch control layer includes a plurality of first touch control electrodes, a plurality of first connecting parts arranged successively along a first extending direction and a plurality of second touch control electrodes arranged sequentially along a second extending direction, wherein the first extending direction intersects with the second extending direction. The plurality of first touch control electrodes and the plurality of first connecting parts are arranged alternately and connected in sequence. The plurality of second touch control electrodes are arranged at intervals. The bridge layer includes a plurality of connecting bridges each includes bonding pad parts and second connecting wires, wherein the bonding pad parts are configured to be coupled with adjacent second touch control electrodes through via holes on an insulating layer and wherein the second connecting wires are configured to be coupled with the bonding pad parts.

The touch control structure comprises a Bridge region. The Bridge region further includes a plurality of second connecting units and first connecting wires, wherein the positions of the second connecting units correspond to the positions of the bonding pad parts on the bridge layer, the second connecting units are configured to be coupled with the bonding pad parts through via holes on the insulating layer, orthographic projections of the first connecting wires on the substrate are basically overlapped with orthographic projections of the second connecting wires on the substrate.

In some possible implementations, the first connecting wires comprise a plurality of mesh pattern units which are provided with a plurality of cuts for disconnecting the metal wires of the mesh pattern units, wherein the mesh pattern units at least includes two mutually parallel first sides and two mutually parallel second sides, wherein the first sides and the second sides are non-parallel.

The cuts include consecutive cuts, the number of the cuts in the consecutive cuts is less than or equal to 3. The consecutive cuts are cuts which are provided on both of the two first sides of each of the mesh pattern unit in at least one mesh pattern unit arranged continuously along a first direction, wherein the first direction intersects with the first sides of each mesh pattern unit, or the consecutive cuts are cuts which are provided on both of the two second sides of each mesh pattern unit in at least one mesh pattern unit arranged continuously along a second direction, wherein the second direction intersects with the second sides of each mesh pattern unit.

In some possible implementations, the cuts also include corner cuts. When the corner cuts have consecutive cuts along the first direction or the second direction, the number of cuts in the consecutive cuts is less than or equal to 2. The corner cuts are cuts arranged on one first side and one second side of the mesh pattern unit.

In some possible implementations, when there are a plurality of corner cuts, the plurality of corner cuts constitute an open shape.

In some possible implementations, the touch control structure further includes a Bulk region and a Bridge region. The Bulk region includes first touch control electrodes and second touch control electrodes. Each mesh pattern unit located in the Boundary region is provided with cuts for disconnecting the metal wires of the mesh pattern units, which enable each mesh pattern unit to be divided into two parts respectively belonging to the first touch control electrodes and the second touch control electrodes; in a plurality of repeating units which are repetitive and continuously arranged for forming the touch control structure layer, the repeating units are divided into first repeating units containing cuts in the Bridge region, second repeating units containing cuts in the Bulk region and third repeating units containing cuts in the Boundary region.

The ratio of the cut density of the first repeating units to the cut density of the second repeating units is 0.7-1.3; the ratio of the cut density of the first repeating units to the cut density of the third repeating units is 0.7-1.3; the ratio of the cut density of the second repeating units to the cut density of the third repeating units is 0.7-1.3; The cut density is the ratio of the number of cuts in a repeating unit to the number of mesh pattern units in a repeating unit.

In some possible implementations, the cuts at least include first direction cuts that disconnect the first sides and second direction cuts that disconnect the second sides.

The ratio of the cut density of the first repeating units to the cut density of the second repeating units is 0.7-1.3, which includes any one or more of the following: the ratio of the first direction cut density of the first repeating units to the first direction cut density of the second repeating units is 0.7-1.3; the ratio of the second direction cut density of the first repeating units to the second direction cut density of the second repeating units is 0.7-1.3.

The ratio of the cut density of the first repeating units to the cut density of the third repeating units is 0.7-1.3, which includes any one or more of the following: the ratio of the first direction cut density of the first repeating units to the first direction cut density of the third repeating units is 0.7-1.3; the ratio of the second direction cut density of the first repeating units to the second direction cut density of the third repeating units is 0.7-1.3.

The ratio of the cut density of the second repeating units to the cut density of the third repeating units is 0.7-1.3, which includes any one or more of the following: the ratio of the first direction cut density of the second repeating units to the first direction cut density of the third repeating units is 0.7-1.3; the ratio of the second direction cut density of the second repeating units to the second direction cut density of the third repeating units is 0.7-1.3.

The first direction cut density is the ratio of the number of first direction cuts in repeating units to the number of mesh pattern units in repeating units, and the second direction cut density is the ratio of the number of second direction cuts in repeating units to the number of mesh pattern units in repeating units.

In some possible implementations, the plurality of sub-pixels include first subpixels emitting a first color, second subpixels a second color and third subpixels emitting a third color.

In the first repeating units, the second repeating units and the third repeating units, the cuts include first cuts between the first and second subpixels, second cuts between the second and third subpixels and third cuts between the first and third subpixels.

In the first repeating units, the second repeating units and the third repeating units, the ratio of the first cut density to the second cut density is 0.7-1.3; the ratio of the first cut density to the third cut density is 0.7-1.3; the ratio of the second cut density to the third cut density is 0.7-1.3.

The first cut density is the ratio of the number of first cuts in repeating units to the number of mesh pattern units in repeating units; the second cut density is the ratio of the number of second cuts in repeating units to the number of mesh pattern units in repeating units; and the third cut density is the ratio of the number of third cuts in repeating units to the number of mesh pattern units in repeating units.

In some possible implementations, the ratio of the first cut density to the second cut density is 0.7-1.3, which includes any one or more of the following: the ratio of the first horizontal cut density to the second horizontal cut density is 0.7-1.3; the ratio of the first vertical cut density to the second vertical cut density is 0.7-1.3; and the ratio of the first diagonal cut density to the second diagonal cut density is 0.7-1.3.

The ratio of the second cut density to the third cut density is 0.7-1.3, which includes any one or more of the following: the ratio of the second horizontal cut density to the third horizontal cut density is 0.7-1.3; the ratio of the second vertical cut density to the third vertical cut density is 0.7-1.3; and the ratio of the second diagonal cut density to the third diagonal cut density is 0.7-1.3.

The ratio of the first cut density to the third cut density is 0.7-1.3, which includes any one or more of the following: the ratio of the first horizontal cut density to the third horizontal cut density is 0.7-1.3; the ratio of the first vertical cut density to the third vertical cut density is 0.7-1.3; and the ratio of the first diagonal cut density to the third diagonal cut density is 0.7-1.3.

In some possible implementations, the ratio of the first cut density of the first repeating units to the first cut density of the second repeating units is 0.7-1.3; the ratio of the second cut density of the first repeating units to the second cut density of the second repeating units is 0.7-1.3; and the ratio of the third cut density of the first repeating units to the third cut density of the second repeating units is 0.7-1.3.

The ratio of the first cut density of the first repeating units to the first cut density of the third repeating units is 0.7-1.3; the ratio of the second cut density of the first repeating units to the second cut density of the third repeating units is 0.7-1.3; and the ratio of the third cut density of the first repeating units to the third cut density of the third repeating units is 0.7-1.3.

The ratio of the first cut density of the second repeating units to the first cut density of the third repeating units is 0.7-1.3; the ratio of the second cut density of the second repeating units to the second cut density of the third repeating units is 0.7-1.3; and the ratio of the third cut density of the second repeating units to the third cut density of the third repeating units is 0.7-1.3.

In some possible implementations, the maximum characteristic length of the second repeating unit is S, which meets $S=L*\tan(1/(57.3*CPD))$, wherein L is the distance from the viewer's eyes to the display screen, CPD is the spatial frequency of the viewer's eyes within 1 degree, L is 100 mm to 1000 mm while CPD is greater than or equal to 10, the maximum characteristic length of the repeating unit is the maximum size of the repeating unit in a certain direction, and $1/(57.3*CPD)$ is a radian value.

In some possible implementations, when the distance from the viewer's eyes to the display screen is 100 mm to 400 mm, the maximum characteristic length of the second repeating unit is 0.2 mm to 0.4 mm; when the distance from the viewer's eyes to the display screen is 400 mm to 1000 mm, the maximum characteristic length of the second repeating unit is 0.4 mm to 1.2 mm.

The present disclosure further provides a display device which includes any one of the aforementioned display panels. The display device may be any product or component with a display function such as a mobile phone, a tablet computer, a television, a display, a notebook computer, a digital photo frame, a navigator, etc.

The accompanying drawings of the present application are only related to the structures to which the present application is related, and other structures may be referred to general designs.

Without conflict, the embodiments of the present disclosure, i.e., the features in the embodiments may be combined to each other to obtain a new embodiment.

A person of ordinary skills in the art should understand that any modification or equivalent substitution of the technical solutions in the present disclosure, if not beyond the spirit and scope of the technical solutions in the present disclosure, should be covered within the scope of protection of the claims of the present application.

What is claimed is:

1. A display panel, comprising:
a substrate, a display structure layer disposed on the substrate and a touch control structure layer disposed on the display structure layer, wherein:
the display structure layer comprises a light-emitting region and a non-light-emitting region, the light-emitting region comprises a plurality of periodically-arranged subpixels, and the non-light-emitting region comprises subpixel boundaries between adjacent subpixels; the touch control structure layer comprises a plurality of mesh pattern units which are polygons formed by metal wires, and a region enclosed by orthographic projections of the metal wires on the substrate contains an orthographic projection of at least one subpixel on the substrate, and orthographic projections of subpixel boundaries on the substrate contain the orthographic projections of the metal wires on the substrate;
in a direction parallel to the display panel, the touch control structure layer comprises a Bulk region, a Boundary region and a Bridge region;
in a direction perpendicular to the display panel and in the Bridge region, the touch control structure layer comprises a bridge layer, an insulating layer and a touch control layer which are in a stacked arrangement;
in the Bridge region, the touch control layer of the touch control structure layer comprises an upper layer metal mesh, and the upper layer metal mesh comprises a part of the plurality of the mesh pattern units, the upper layer metal mesh comprises a plurality of first touch control electrodes and a plurality of first connecting parts arranged sequentially along a first extending direction and a plurality of second touch control electrodes arranged sequentially along a second extending direction, and the upper layer metal mesh further comprises second connecting units and first connecting wires, wherein the first extending direction intersects with the second extending direction; the plurality of first touch control electrodes and the plurality of first connecting parts are arranged alternately and connected in sequence, and the plurality of second touch control electrodes are arranged at intervals;
in the Bridge region, the bridge layer of the touch control structure layer comprises a lower layer metal mesh, the lower layer metal mesh comprises a part of the plurality of the mesh pattern units, the lower layer metal mesh comprises bonding pad parts and second connecting wires, wherein the bonding pad parts are configured to be coupled with adjacent second touch control electrodes through via holes on the insulating layer, and the second connecting wires are configured to be coupled with the bonding pad parts;
the second connecting units and the first connecting wires are arranged at intervals and insulated from each other, positions of the second connecting units correspond to positions of the bonding pad parts, the second connecting units are configured to be coupled with the bonding pad parts through via holes on the insulating layer, orthographic projections of the first connecting wires on the substrate substantially are overlapped with orthographic projections of the second connecting wires on the substrate;
the first connecting wires on the touch control structure layer comprises a part of the plurality of mesh pattern units which are provided with a plurality of cuts for disconnecting the metal wires of the mesh pattern units, wherein a mesh pattern unit at least comprises two mutually parallel first sides and two mutually parallel second sides, and the first sides and the second sides are non-parallel;
the cuts comprise consecutive cuts, a quantity of cuts in the consecutive cuts is less than or equal to 3, the consecutive cuts are cuts which are provided on both of the two first sides of each mesh pattern unit in at least one mesh pattern unit arranged continuously along a first direction, wherein the first direction intersects with the first sides of each mesh pattern unit, or the consecutive cuts are cuts which are provided on both of the two second sides of each mesh pattern unit in at least one mesh pattern unit arranged continuously along a second direction, wherein the second direction intersects with the second sides of each mesh pattern unit;
the Bulk region comprises the first touch control electrodes and the second touch control electrodes, and each mesh pattern unit located in the Boundary region is provided with cuts for disconnecting metal wires of the mesh pattern units, which enable each mesh pattern unit to be divided into two parts respectively belonging to the first touch control electrodes and the second touch control electrodes;
the plurality of mesh pattern units of the touch control structure layer are divided into a plurality of repeating units, each repeating unit comprises a same quantity of mesh pattern units of the plurality of mesh pattern units, all the repeating units are in a shape of square and have same area, the repeating units comprise first repeating units containing the mesh pattern units in the Bridge region, second repeating units containing the mesh pattern units in the Bulk region and third repeating units containing the mesh pattern units in the Boundary region, wherein the mesh pattern units in two diagonal lines of the first repeating units are provided with cuts; and the mesh pattern units of the second repeating units are provided with cuts; and the mesh pattern units in one diagonal line of the third repeating units are provided with cuts;
a ratio of a cut density of the first repeating units to a cut density of the second repeating units is 0.7-1.3; a ratio of the cut density of the first repeating units to a cut density of the third repeating units is 0.7-1.3; a ratio of the cut density of the second repeating units to the cut density of the third repeating units is 0.7-1.3; the cut density is a ratio of a quantity of cuts in the repeating units to a quantity of mesh pattern units in the repeating units;
wherein the plurality of subpixels comprise first subpixels emitting light of a first color, second subpixels emitting light of a second color and third subpixels emitting light of a third color; in the first repeating units, the second repeating units and the third repeating units, the cuts comprise first cuts between the first and second subpixels, second cuts between the second and third subpixels and third cuts between the first and third subpixels;

in the first repeating units, the second repeating units and the third repeating units, a ratio of a first cut density to a second cut density is 0.7-1.3; a ratio of a second cut density to a third cut density is 0.7-1.3; a ratio of a first cut density to a third cut density is 0.7-1.3;

the first cut density is a ratio of a quantity of first cuts in the repeating units to a quantity of the mesh pattern units in the repeating units; the second cut density is a ratio of a quantity of second cuts in the repeating units to the quantity of the mesh pattern units in the repeating units; and the third cut density is a ratio of a quantity of third cuts in the repeating units to the quantity of the mesh pattern units in the repeating units;

the ratio of the first cut density to the second cut density is 0.7-1.3, which comprises any one or more of the following: a ratio of a first horizontal cut density to a second horizontal cut density is 0.7-1.3; a ratio of a first vertical cut density to a second vertical cut density is 0.7-1.3; and a ratio of a first diagonal cut density to a second diagonal cut density is 0.7-1.3;

the ratio of the second cut density to the third cut density is 0.7-1.3, which comprises any one or more of the following: a ratio of a second horizontal cut density to a third horizontal cut density is 0.7-1.3; a ratio of a second vertical cut density to a third vertical cut density is 0.7-1.3; and a ratio of a second diagonal cut density to a third diagonal cut density is 0.7-1.3; and the ratio of the first cut density to the third cut density is 0.7-1.3, which comprises any one or more of the following: a ratio of a first horizontal cut density to a third horizontal cut density is 0.7-1.3; a ratio of a first vertical cut density to a third vertical cut density is 0.7-1.3; and a ratio of a first diagonal cut density to a third diagonal cut density is 0.7-1.3.

2. The display panel according to claim 1, wherein the cuts further comprise corner cuts, in a situation that the corner cuts have consecutive cuts along the first direction or the second direction, a quantity of cuts in the consecutive cuts is less than or equal to 2; the corner cuts are cuts arranged on one first side and one second side of the mesh pattern unit.

3. The display panel according to claim 2, when there are a plurality of the corner cuts, the plurality of corner cuts are formed an open shape.

4. The display panel according to claim 1, wherein the cuts at least comprise first direction cuts that disconnect the first sides and second direction cuts that disconnect the second sides, wherein:

the ratio of the cut density of the first repeating units to the cut density of the second repeating units is 0.7-1.3, which comprises any one or more of the following: a ratio of a first direction cut density of the first repeating units to a first direction cut density of the second repeating units is 0.7-1.3; a ratio of a second direction cut density of the first repeating units to a second direction cut density of the second repeating units is 0.7-1.3;

the ratio of the cut density of the first repeating units to the cut density of the third repeating units is 0.7-1.3, which comprises any one or more of the following: a ratio of a first direction cut density of the first repeating units to a first direction cut density of the third repeating units is 0.7-1.3; a ratio of a second direction cut density of the first repeating units to a second direction cut density of the third repeating units is 0.7-1.3;

the ratio of the cut density of the second repeating units to the cut density of the third repeating units is 0.7-1.3, which comprises any one or more of the following: a ratio of a first direction cut density of the second repeating units to a first direction cut density of the third repeating units is 0.7-1.3; a ratio of a second direction cut density of the second repeating units to a second direction cut density of the third repeating units is 0.7-1.3;

the first direction cut density is a ratio of a quantity of the first direction cuts in the repeating units to a quantity of the mesh pattern units in the repeating units, and the second direction cut density is a ratio of a quantity of the second direction cuts in the repeating units to the quantity of the mesh pattern units in the repeating units.

5. The display panel according to claim 1, wherein a ratio of the first cut density of the first repeating units to the first cut density of the second repeating units is 0.7-1.3; a ratio of the second cut density of the first repeating units to the second cut density of the second repeating units is 0.7-1.3; and a ratio of the third cut density of the first repeating units to the third cut density of the second repeating units is 0.7-1.3;

a ratio of the first cut density of the first repeating units to the first cut density of the third repeating units is 0.7-1.3; a ratio of the second cut density of the first repeating units to the second cut density of the third repeating units is 0.7-1.3; and a ratio of the third cut density of the first repeating units to the third cut density of the third repeating units is 0.7-1.3;

a ratio of the first cut density of the second repeating units to the first cut density of the third repeating units is 0.7-1.3; a ratio of the second cut density of the second repeating units to the second cut density of the third repeating units is 0.7-1.3; and a ratio of the third cut density of the second repeating units to the third cut density of the third repeating units is 0.7-1.3.

6. The display panel according to claim 1, wherein a maximum characteristic length of the second repeating unit is S, wherein, $S=L*\tan(1/(57.3*CPD))$, L is a distance from a viewer's eyes to a display screen, CPD is a spatial frequency of the viewer's eyes within a range of 1 degree, L is between 100 mm to 1000 mm and CPD is greater than or equal to 10; the maximum characteristic length of the repeating unit is a maximum size of the repeating unit in a certain direction.

7. The display panel according to claim 6, wherein when the distance from the viewer's eyes to the display screen is 100 mm to 400 mm, the maximum characteristic length of the second repeating unit is 0.2 mm to 0.4 mm; when the distance from the viewer's eyes to the display screen is 400 mm to 1000 mm, the maximum characteristic length of the second repeating unit is 0.4 mm to 1.2 mm.

8. A display device, comprising the display panel of claim 1.

9. A touch control structure, comprising:
a plurality of mesh pattern units which are polygons formed of metal wires, wherein:
in a direction parallel to the display panel, the touch control structure comprises a Bulk region, a Boundary region and a Bridge region;
in a direction perpendicular to the display panel and in the Bridge region, the touch control structure comprises a bridge layer, an insulating layer and a touch control layer which are in a stacked arrangement;
in the Bridge region, the touch control layer of the touch control structure comprises an upper layer metal mesh, and the upper layer metal mesh comprises a part of the plurality of the mesh pattern units, the upper layer metal mesh comprises a plurality of first touch control electrodes and a plurality of first connecting parts arranged sequentially along a first extending direction and a plurality of second touch control electrodes arranged sequentially along a second extending direction, and the upper layer metal mesh further comprises second connecting units and first connecting wires, wherein the first extending direction intersects with the second extending direction; the plurality of first touch control electrodes and the plurality of first connecting parts are arranged alternately and connected in sequence, and the plurality of second touch control electrodes are arranged at intervals;

in the Bridge region, the bridge layer of the touch control structure comprises a lower layer metal mesh, the lower layer metal mesh comprises a part of the plurality of the mesh pattern units, the lower layer metal mesh comprises bonding pad parts and second connecting wires, wherein the bonding pad parts are configured to be coupled with adjacent second touch control electrodes through via holes on the insulating layer and the second connecting wires are configured to be coupled with the bonding pad parts;

the second connecting units and the first connecting wires are arranged at intervals and insulated from each other, positions of the second connecting units correspond to positions of the bonding pad parts, the second connecting units are configured to be coupled with the bonding pad parts through via holes on the insulating layer, orthographic projections of the first connecting wires on a substrate substantially are overlapped with orthographic projections of the second connecting wires on the substrate;

the first connecting wires in the touch control structure comprises a part of the plurality of mesh pattern units which are provided with a plurality of cuts for disconnecting the metal wires of the mesh pattern units, wherein a mesh pattern unit at least comprises two mutually parallel first sides and two mutually parallel second sides and the first sides and the second sides are non-parallel;

the cuts comprise consecutive cuts, a quantity of cuts in the consecutive cuts is less than or equal to 3, the consecutive cuts are cuts which are provided on both of the two first sides of each mesh pattern unit in at least one mesh pattern unit arranged continuously along a first direction, wherein the first direction intersects with the first sides of each mesh pattern unit, or the consecutive cuts are cuts which are provided on both of the two second sides of each mesh pattern unit in at least one mesh pattern unit arranged continuously along a second direction, wherein the second direction intersects with the second sides of each mesh pattern unit;

the Bulk region comprises the first touch control electrodes and the second touch control electrodes, and each mesh pattern unit located in the Boundary region is provided with cuts for disconnecting metal wires of the mesh pattern units, which enable each mesh pattern unit to be divided into two parts respectively belonging to the first touch control electrodes and the second touch control electrodes;

the plurality of mesh pattern units of the touch control structure layer are divided into a plurality of repeating units, each repeating unit comprises a same quantity of mesh pattern units of the plurality of mesh pattern units, all the repeating units are in a shape of square and have same area, the repeating units comprise first repeating units containing the mesh pattern units in the Bridge region, second repeating units containing the mesh pattern units in the Bulk region and third repeating units containing the mesh pattern units in the Boundary region, wherein the mesh pattern units in two diagonal lines of the first repeating units are provided with cuts; and the mesh pattern units of the second repeating units are provided with cuts; and the mesh pattern units in one diagonal line of the third repeating units are provided with cuts;

a ratio of a cut density of the first repeating units to a cut density of the second repeating units is 0.7-1.3; a ratio of the cut density of the first repeating units to a cut density of the third repeating units is 0.7-1.3; a ratio of the cut density of the second repeating units to the cut density of the third repeating units is 0.7-1.3; the cut density is a ratio of a quantity of cuts in the repeating units to a quantity of mesh pattern units in the repeating units; and a maximum characteristic length of the second repeating unit is S, wherein, $S=L*\tan(1/(57.3*CPD))$, L is a distance from a viewer's eyes to a display screen, CPD is a spatial frequency of the viewer's eyes within a range of 1 degree, L is between 100 mm to 1000 mm and CPD is greater than or equal to 10; the maximum characteristic length of the repeating unit is a maximum size of the repeating unit in a certain direction.

10. The touch control structure according to claim 9, wherein the cuts further comprise corner cuts, in a situation that the corner cuts have consecutive cuts along the first direction or the second direction, a quantity of cuts in the consecutive cuts is less than or equal to 2; the corner cuts are cuts arranged on one first side and one second side of the mesh pattern unit.

11. The touch control structure according to claim 10, when there are a plurality of the corner cuts, the plurality of corner cuts are formed an open shape.

12. The touch control structure according to claim 9, wherein the cuts at least comprise first direction cuts that disconnect the first sides and second direction cuts that disconnect the second sides, wherein the ratio of the cut density of the first repeating units to the cut density of the second repeating units is 0.7-1.3, which comprises any one or more of the following: a ratio of a first direction cut density of the first repeating units to a first direction cut density of the second repeating units is 0.7-1.3; a ratio of a second direction cut density of the first repeating units to a second direction cut density of the second repeating units is 0.7-1.3;

the ratio of the cut density of the first repeating units to the cut density of the third repeating units is 0.7-1.3, which comprises any one or more of the following: a ratio of a first direction cut density of the first repeating units to a first direction cut density of the third repeating units is 0.7-1.3; a ratio of a second direction cut density of the first repeating units to a second direction cut density of the third repeating units is 0.7-1.3;

the ratio of the cut density of the second repeating units to the cut density of the third repeating units is 0.7-1.3, which comprises any one or more of the following: a ratio of a first direction cut density of the second repeating units to a first direction cut density of the third repeating units is 0.7-1.3; a ratio of a second direction cut density of the second repeating units to a second direction cut density of the third repeating units is 0.7-1.3;

the first direction cut density is a ratio of a quantity of first direction cuts in the repeating units to the quantity of the mesh pattern units in the repeating units, and the second direction cut density is a ratio of a quantity of second direction cuts in the repeating units to the quantity of the mesh pattern units in the repeating units.

13. The touch control structure according to claim 9, wherein the touch control structure is comprised in a display panel, the display panel further comprises a display structure layer, wherein the display structure layer comprises a light-emitting region and a non-light-emitting region, the light-emitting region comprises a plurality of periodically-arranged subpixels, the plurality of subpixels comprise first subpixels emitting light of a first color, second subpixels emitting light of a second color and third subpixels emitting light of a third color; in the first repeating units, the second repeating units and the third repeating units, the cuts comprise first cuts between the first and second subpixels, second cuts between the second and third subpixels and third cuts between the first and third subpixels;

in the first repeating units, the second repeating units and the third repeating units, a ratio of a first cut density to a second cut density is 0.7-1.3; a ratio of a second cut density to a third cut density is 0.7-1.3; a ratio of a first cut density to a third cut density is 0.7-1.3, the first cut density is a ratio of a quantity of first cuts in the repeating units to the quantity of the mesh pattern units in the repeating units; the second cut density is a ratio of a quantity of second cuts in the repeating units to the quantity of the mesh pattern units in the repeating units; and the third cut density is a ratio of a quantity of third cuts in the repeating units to the quantity of the mesh pattern units in repeating units.

14. A display panel, comprising:

a substrate, a display structure layer disposed on the substrate and a touch control structure layer disposed on the display structure layer, wherein:

the display structure layer comprises a light-emitting region and a non-light-emitting region, the light-emitting region comprises a plurality of periodically-arranged subpixels, and the non-light-emitting region comprises subpixel boundaries between adjacent subpixels; the touch control structure layer comprises a plurality of mesh pattern units which are polygons formed by metal wires, and a region enclosed by orthographic projections of the metal wires on the substrate contains an orthographic projection of at least one subpixel on the substrate, and orthographic projections of subpixel boundaries on the substrate contain the orthographic projections of the metal wires on the substrate;

in a direction parallel to the display panel, the touch control structure layer comprises a Bulk region, a Boundary region and a Bridge region;

in a direction perpendicular to the display panel and in the Bridge region, the touch control structure layer comprises a bridge layer, an insulating layer and a touch control layer which are in a stacked arrangement;

in the Bridge region, the touch control layer of the touch control structure layer comprises an upper layer metal mesh, and the upper layer metal mesh comprises a part of the plurality of the mesh pattern units, the upper layer metal mesh comprises a plurality of first touch control electrodes and a plurality of first connecting parts arranged sequentially along a first extending direction and a plurality of second touch control electrodes arranged sequentially along a second extending direction, and the upper layer metal mesh further comprises second connecting units and first connecting wires, wherein the first extending direction intersects with the second extending direction; the plurality of first touch control electrodes and the plurality of first connecting parts are arranged alternately and connected in sequence, and the plurality of second touch control electrodes are arranged at intervals;

in the Bridge region, the bridge layer of the touch control structure layer comprises a lower layer metal mesh, the lower layer metal mesh comprises a part of the plurality of the mesh pattern units, the lower layer metal mesh comprises two connecting meshes arranged symmetrically relative to the direction perpendicular to the display panel, each connecting mesh of the two connecting meshes comprises a plurality of connecting bridges, each connecting bridge of the plurality of connecting bridges comprises bonding pad parts and second connecting wires, wherein the bonding pad parts are configured to be coupled with adjacent second touch control electrodes through via holes on the insulating layer, and the second connecting wires are configured to be coupled with the bonding pad parts; and wherein the second connecting units and the first connecting wires are arranged at intervals and insulated from each other, positions of the second connecting units correspond to positions of the bonding pad parts, the second connecting units are configured to be coupled with the bonding pad parts through via holes on the insulating layer, orthographic projections of the first connecting wires on the substrate substantially are overlapped with orthographic projections of the second connecting wires on the substrate, a reflection of metal wires in the lower layer metal mesh in the Bridge region is blocked by the first connecting wires disposed on the upper layer metal mesh.

\* \* \* \* \*